US012027376B2

(12) United States Patent
More et al.

(10) Patent No.: US 12,027,376 B2
(45) Date of Patent: Jul. 2, 2024

(54) METHOD FOR CUT METAL GATE ETCH DIMENSIONAL CONTROL

(71) Applicant: TAIWAN SEMICONDUCTOR MANUFACTURING COMPANY, LTD., Hsinchu (TW)

(72) Inventors: Shahaji B. More, Hsinchu (TW); Chandrashekhar Prakash Savant, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 370 days.

(21) Appl. No.: 17/313,535

(22) Filed: May 6, 2021

(65) Prior Publication Data

US 2022/0359225 A1 Nov. 10, 2022

(51) Int. Cl.

| | |
|---|---|
| ***H01L 21/8238*** | (2006.01) |
| ***H01L 21/28*** | (2006.01) |
| ***H01L 21/3213*** | (2006.01) |
| ***H01L 21/8234*** | (2006.01) |
| ***H01L 27/092*** | (2006.01) |

(52) U.S. Cl.

CPC .. *H01L 21/32139* (2013.01); *H01L 21/28079* (2013.01); *H01L 21/823437* (2013.01); *H01L 21/823481* (2013.01); *H01L 27/0924* (2013.01)

(58) Field of Classification Search

None

See application file for complete search history.

(56) References Cited

U.S. PATENT DOCUMENTS

| | | | | |
|---|---|---|---|---|
| 7,260,442 | B2 | 8/2007 | Hwang et al. | |
| 9,256,709 | B2 | 2/2016 | Yu et al. | |
| 2014/0040838 | A1 | 2/2014 | Liu et al. | |
| 2015/0278429 | A1 | 10/2015 | Chang | |
| 2017/0125411 | A1* | 5/2017 | Yu | H01L 21/823431 |
| 2017/0222020 | A1* | 8/2017 | Yu | H01L 27/0886 |
| 2019/0103325 | A1* | 4/2019 | Huang | H01L 21/823821 |
| 2020/0105581 | A1* | 4/2020 | Chang | H01L 21/76232 |
| 2020/0135472 | A1* | 4/2020 | Jang | H01L 21/02164 |

* cited by examiner

*Primary Examiner* — Joseph C. Nicely
*Assistant Examiner* — Lamont B Koo
(74) *Attorney, Agent, or Firm* — Hauptman Ham, LLP

(57) ABSTRACT

Provided are methods of manufacturing an integrated circuit device including depositing a conductive layer on a substrate, patterning the conductive layer to expose regions of the conductive layer, etching a first portion of the exposed regions of the conductive layer, forming a first passivation layer on a sidewall of the first etched portion, etching a second portion of the exposed regions of the conductive layer, and forming a second passivation layer on a sidewall of the second etched portion.

20 Claims, 18 Drawing Sheets

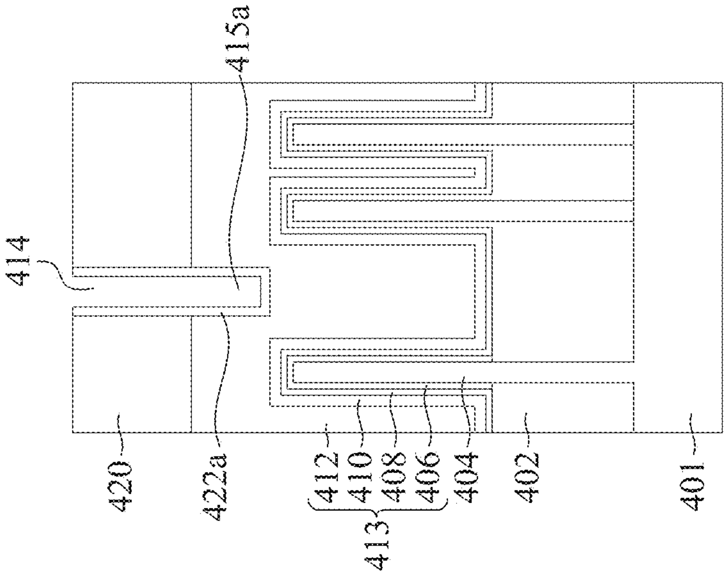
Fig. 4A/B
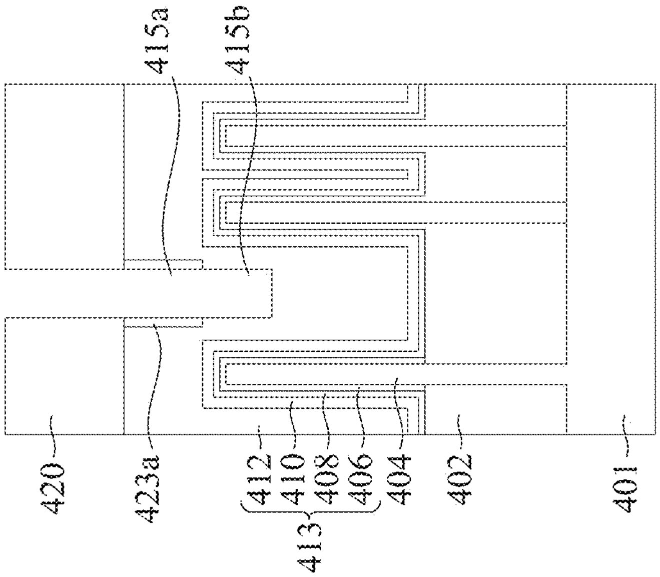
Fig. 4B/C
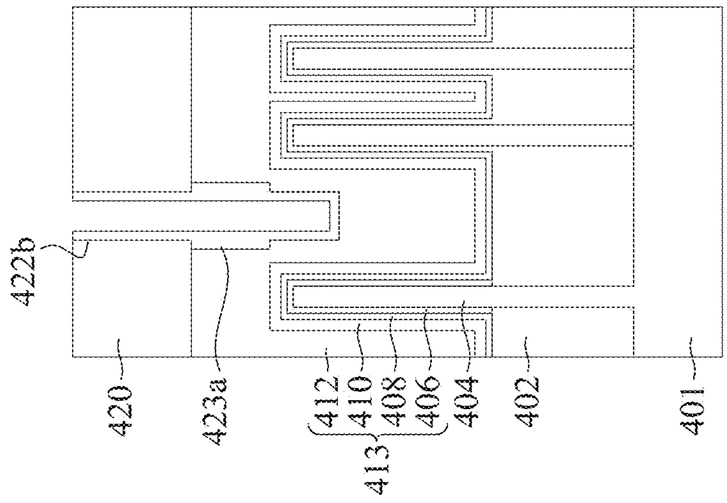
Fig. 4C/D

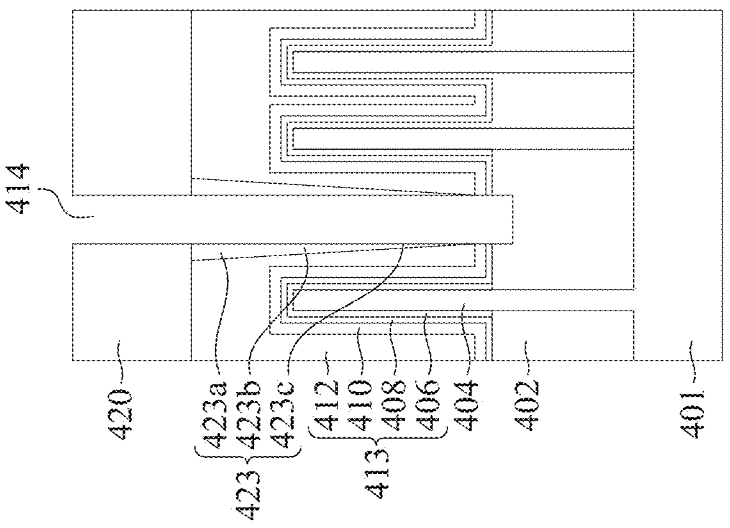
Fig. 4E/E
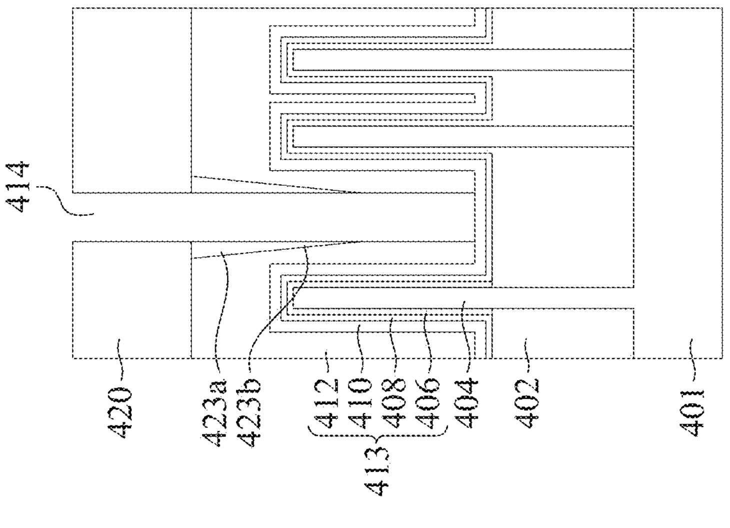
Fig. 4D/E

```
                                                                    800
┌─────────────────────────────────────────────────────────┐
802 ─┤         DEPOSIT AT LEAST ONE INITIAL LAYER          │
└─────────────────────────────────────────────────────────┘
                              │
                              ▼
┌─────────────────────────────────────────────────────────┐
804 ─┤              PATTERN INITIAL LAYER(S)               │
└─────────────────────────────────────────────────────────┘
                              │
                              ▼
┌─────────────────────────────────────────────────────────┐
806 ─┤       ETCH AN Nth PORTION OF INITIAL LAYER(S)       │
└─────────────────────────────────────────────────────────┘
                              │
                              ▼
┌─────────────────────────────────────────────────────────┐
808 ─┤     FORM PASSIVATION LAYER ON SIDEWALLS             │
     │  OF THE Nth ETCHED PORTION OF THE INITIAL LAYER(S)  │
└─────────────────────────────────────────────────────────┘
```

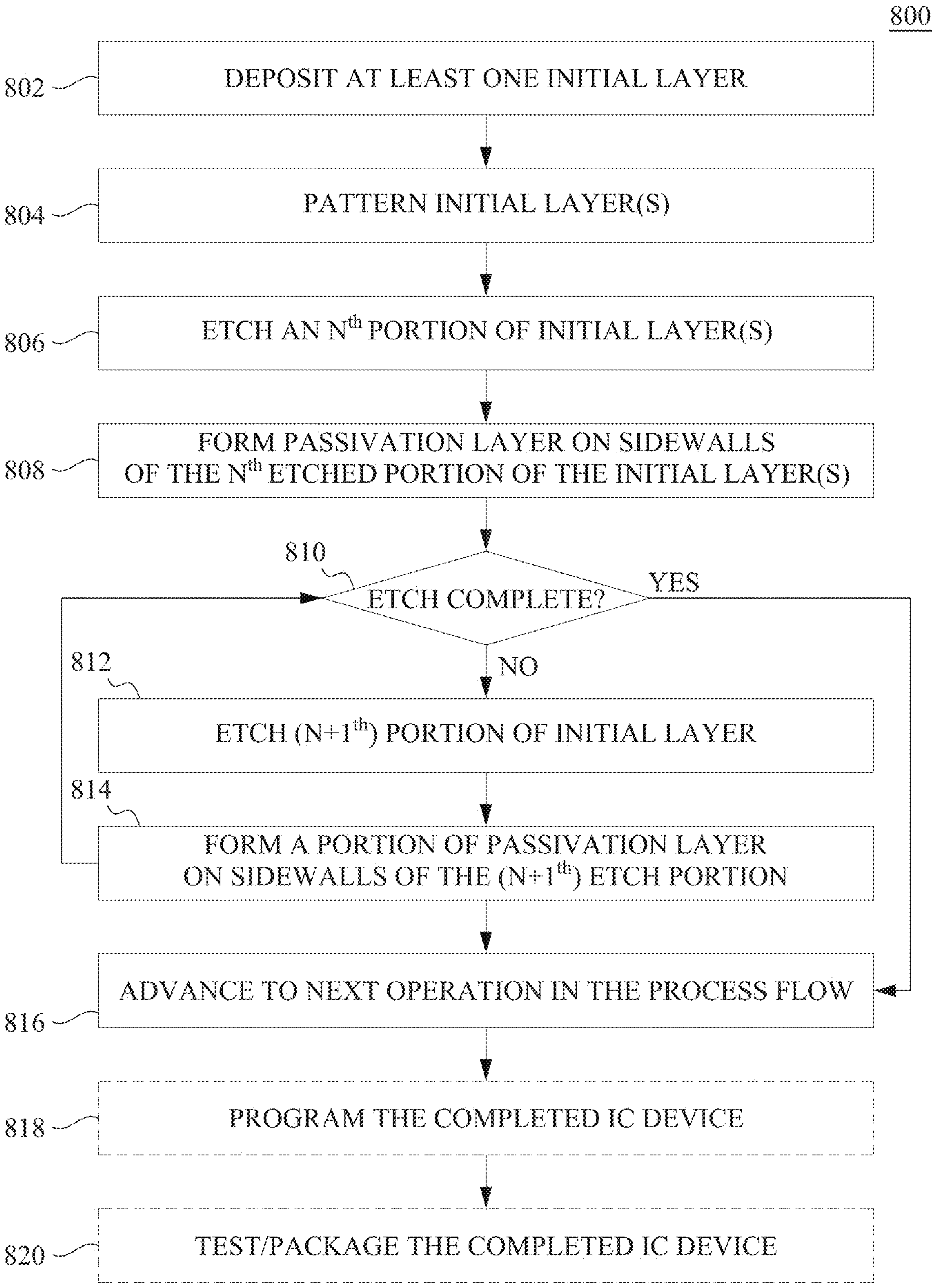

Fig. 8

(Flowchart 800 — steps:)
- 802: DEPOSIT AT LEAST ONE INITIAL LAYER
- 804: PATTERN INITIAL LAYER(S)
- 806: ETCH AN Nth PORTION OF INITIAL LAYER(S)
- 808: FORM PASSIVATION LAYER ON SIDEWALLS OF THE Nth ETCHED PORTION OF THE INITIAL LAYER(S)
- 810: ETCH COMPLETE? — YES → 816; NO → 812
- 812: ETCH (N+1th) PORTION OF INITIAL LAYER
- 814: FORM A PORTION OF PASSIVATION LAYER ON SIDEWALLS OF THE (N+1th) ETCH PORTION (loops back to 810)
- 816: ADVANCE TO NEXT OPERATION IN THE PROCESS FLOW
- 818: PROGRAM THE COMPLETED IC DEVICE
- 820: TEST/PACKAGE THE COMPLETED IC DEVICE

METHOD FOR CUT METAL GATE ETCH DIMENSIONAL CONTROL

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. As the semiconductor industry has progressed into nanometer technology process nodes in pursuit of higher device density, higher performance, and lower costs, challenges from both fabrication and design issues have resulted in the development of three-dimensional designs.

The semiconductor integrated circuit (IC) industry has experienced rapid growth. Technological advances in IC materials and design have produced generations of ICs with each generation having smaller and more complex circuits than the previous generation. However, the semiconductor industry progression into nanometer technology process nodes has resulted in the development of three-dimensional designs including, for example, fin field effect transistor (FinFET) and Gate-All-Around (GAA) devices.

Although advantages of the FinFET include reducing short channel effects and increasing current flow, the associated fabrication processes continue to become more challenging as the feature sizes and spacing continue to decrease.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A/B is a cross-sectional view of FinFET device structures at an intermediate manufacturing step between FIGS. 4A and 4B according to some embodiments.

FIG. 4B/C is a cross-sectional view of FinFET device structures at an intermediate manufacturing step between FIGS. 4B and 4C according to some embodiments.

FIG. 4C/D is a cross-sectional view of FinFET device structures at an intermediate manufacturing step between FIGS. 4C and 4D according to some embodiments.

FIG. 4D/E is a cross-sectional view of FinFET device structures at an intermediate manufacturing step between FIGS. 4D and 4E according to some embodiments.

FIG. 4E/F is a cross-sectional view of FinFET device structures at an intermediate manufacturing step between FIGS. 4E and 4F according to some embodiments.

FIG. 8 is a flowchart of a method of manufacturing a FinFET device according to some embodiments.

DETAILED DESCRIPTION

Figure 1B:
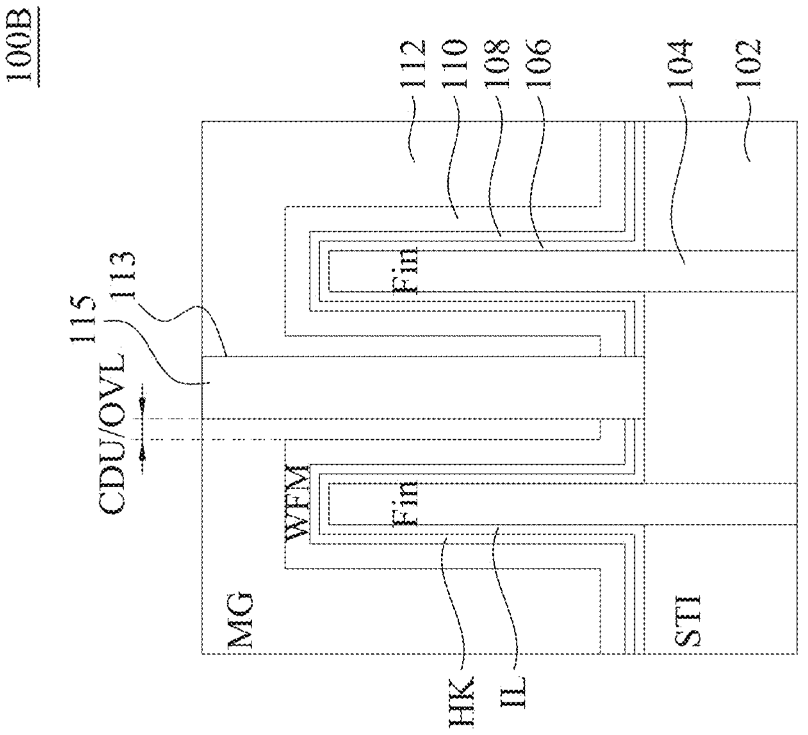
FIGS. 1A and 1B are cross-sectional views of FinFET device structures at an intermediate manufacturing step according to some embodiments.

This description of the exemplary embodiments is intended to be read in connection with the accompanying drawings, which are to be considered part of the entire written description. The following disclosure provides many different embodiments, or examples, for implementing different features of the provided subject matter. The drawings are not to scale and the relative sizing and placement of structures have been modified for clarity rather than dimensional accuracy. Specific examples of components, values, operations, materials, arrangements, or the like, are described below to simplify the present disclosure.

These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "vertical," "horizontal," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus and structures may be otherwise oriented (rotated by, for example, 90°, 180°, or mirrored about a horizontal or vertical axis) and the spatially relative descriptors used herein may likewise be interpreted accordingly.

The structures and methods detailed below relate generally to the structures, designs, and manufacturing methods for IC devices, including fin field effect transistor (FinFET) devices. Although the structures and methods will be discussed in terms of FinFET devices, the structures and methods are not so limited and are suitable for inclusion in manufacturing processes for other classes of IC devices.

In FinFET devices, the mobility performance is influenced by both the epitaxial (EPI) volume and the associated device topography which, in turn, is dependent on factors including the profile of the cut metal gate (CMG) etch opening. Embodiments of the disclosed methods, by providing improved control of the CMG etch opening profile by forming a sidewall passivation layer after completing incremental portions of the CMG full, will tend to reduce manufacturing defects while improving device mobility and performance.

In particular, the difficulty in maintaining the sizing of the photoresist (PR) openings during the CMG etch as determined at the after etch inspection (AEI) are indicative of the likelihood and nature of associated defects. If the post-etch PR opening is larger than the manufacturing target, there is an increased likelihood of overetch-related damage to the adjacent structures.

As the scale of the integrated circuits decrease in some technology nodes that utilize more demanding pitches, the previous cut poly processes are, in some cases, being replaced by CMG processes for reducing end cap sealing concerns and improving the subsequent metal gate filling concerns. When the metal gate cut profile departs from the vertical, however, there is an increased likelihood of CMG gas damage to the high-κ-metal gate composite (HKMG) layers previously formed on the fin or nanosheet. In some instances, such CMG gas damage to the HKMG layers is associated with a degradation of the final device threshold voltage (Vt) and/or reduced device reliability.

Figure 1A:
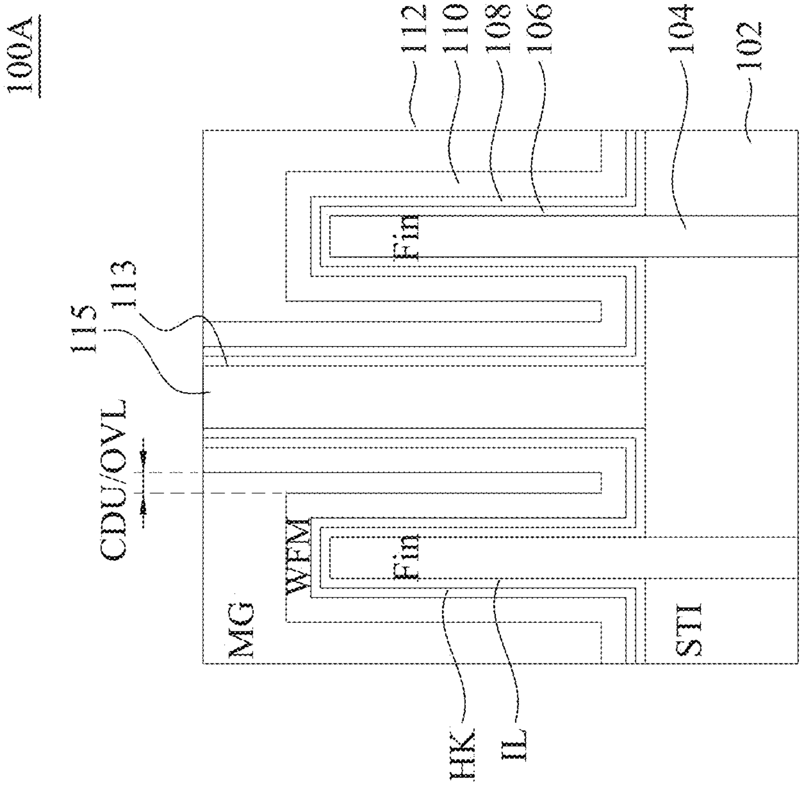

FIG. 1A is a cross-sectional view of FinFET device structures 100A at an intermediate manufacturing step according to some embodiments including a shallow trench isolation (STI) structure 102, a fin structure 104, an interfacial layer 106, a high-x layer 108, a work function metal (WFM) layer 110, and metal gate (MG) layer 112, a poly cut opening (PCO) 113, and a dielectric fill material 115 filling the PCO. In some embodiments according to FIG. 1A, the PCO 113 is formed and the fill material 115 is deposited before the sequential deposition of the high-x layer 108, the WFM layer 110, and metal gate layer 112 and before a replacement poly gate (RPG) is conducted. In some embodiments, the metal gate layer 112 extends between the WFM layers 110 formed on opposing surfaces of the fin structure 104 and the sidewalls of the dielectric fill material 115. In some embodiments, the reduced spacing of the gap between the fin structures 104 and the dielectric fill material 115 resulting from the deposition of the high-x layer 108 and the WFM layer 110 can complicate the deposition of the metal gate layer 112 by, for example, resulting in voids within the MG layer 112. As indicated in FIG. 1A, certain spacings between structures may be used in evaluating process spacing compliance using critical dimension uniformity (CDU) and overlay (OVL) structures (CDU/OVL) to ensure that manufacturing process tolerances are being achieved.

FIG. 1B is a cross-sectional view of FinFET device structures 100B at an intermediate manufacturing step according to some embodiments including a shallow trench isolation (STI) structure 102, a fin structure 104, an interfacial layer 106, a high-κ layer 108, a work function metal (WFM) layer 110, and metal gate (MG) layer 112, a poly cut opening (PCO) 113, and a dielectric fill material 115 filling the PCO 113. In some embodiments according to FIG. 1B, the PCO 113 and the dielectric fill material 115 are formed after the sequential deposition of the high-κ layer 108 and the WFM layer 110, but before deposition of the metal gate layer 112, with the metal gate layer extending between the WFM layers 110 and an opposing sidewall of the dielectric fill material 115. Further, in some embodiments according to FIG. 1B, the PCO 113 extends through the high-κ layer 108 and the WFM layer 110 to contact and, in some embodiments, extend into, the shallow trench isolation structure 102 after a portion of the shallow trench isolation structure 102 is exposed and, in some embodiments, removed during the PCO etch.

Figure 2B:
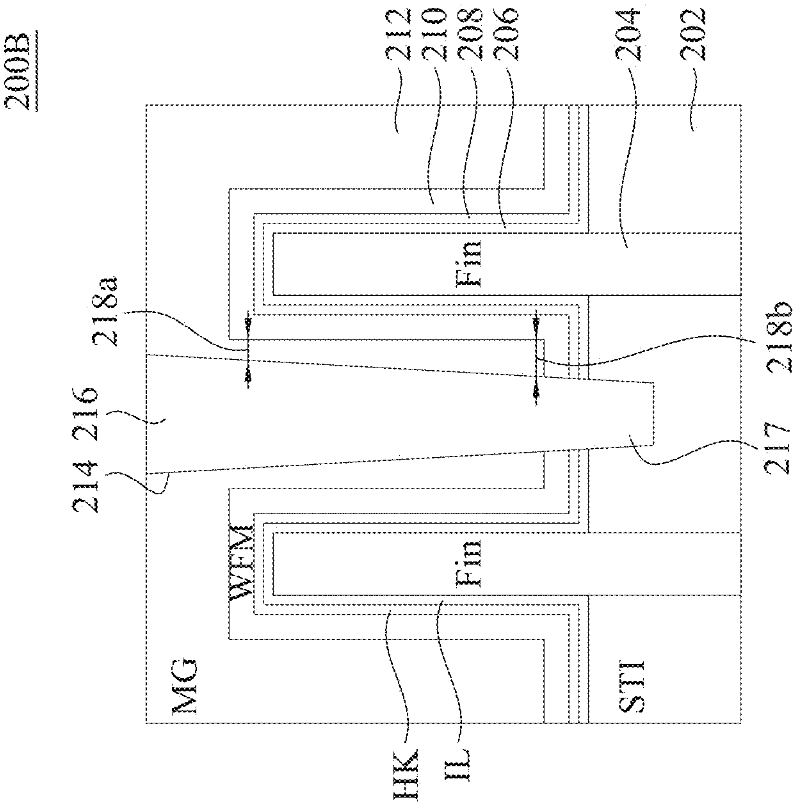
FIGS. 2A and 2B are cross-sectional views of FinFET device structures at an intermediate manufacturing step according to some embodiments.
Figure 2A:
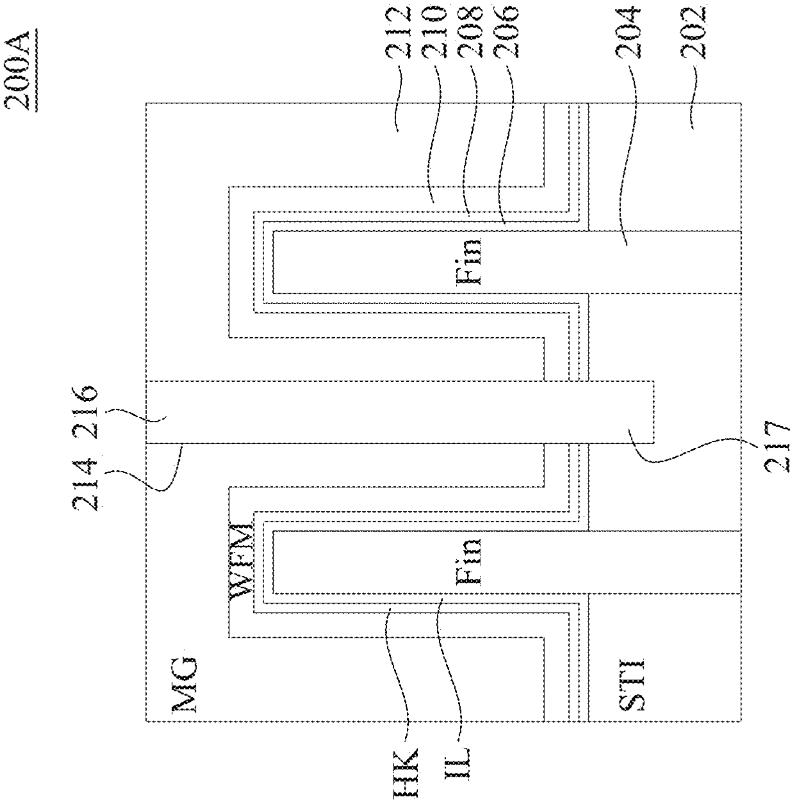

FIG. 2A is a cross-sectional view of FinFET device structures 200A at an intermediate manufacturing step according to some embodiments including a shallow trench isolation (STI) structure 202 (the 2AB numbered elements correspond to the 1AB numbered elements discussed above, e.g., 202 corresponds to 102), a fin structure 204, an interfacial layer 206, a high-κ layer 208, a work function metal (WFM) layer 210, and metal gate (MG) layer 212, a CMG opening 214, and a fill material 216 filling the CMG opening. In some embodiments according to FIG. 2A, the CMG opening 214 is formed with substantially vertical sidewalls through the metal gate layer 212 and forms a rectangular/cylindrical recess 217 in the STI structure 202.

FIG. 2B is a cross-sectional view of FinFET device structures 200B at an intermediate manufacturing step according to some embodiments including a shallow trench isolation (STI) structure 202, a fin structure 204, an interfacial layer 206, a high-x layer 208, a work function metal (WFM) layer 210, and metal gate (MG) layer 212, a CMG opening 214, and a fill material 216 filling the CMG opening. In some embodiments according to FIG. 2B, the CMG opening 214 is formed with non-vertical sidewalls through the metal gate layer 212 and forms a similarly tapered recess 217 in the STI structure 202. In some embodiments according to FIG. 2B, the non-vertical, tapered sidewalls of the CMG opening 214 result in different offset spacing (OS) between an adjacent sidewall of the CMG opening 214 and the WFM layer 210 formed on the fin structure 204 when measured near the top 218*a* of the fin structure 204 or near the bottom 218*b* of the metal gate layer 212. As indicated in FIG. 1B, certain spacings between structures may be used in evaluating process spacing compliance using critical dimension uniformity (CDU) and overlay (OVL) structures (CDU/OVL) to ensure that manufacturing process tolerances are being achieved.

Figure 3B:
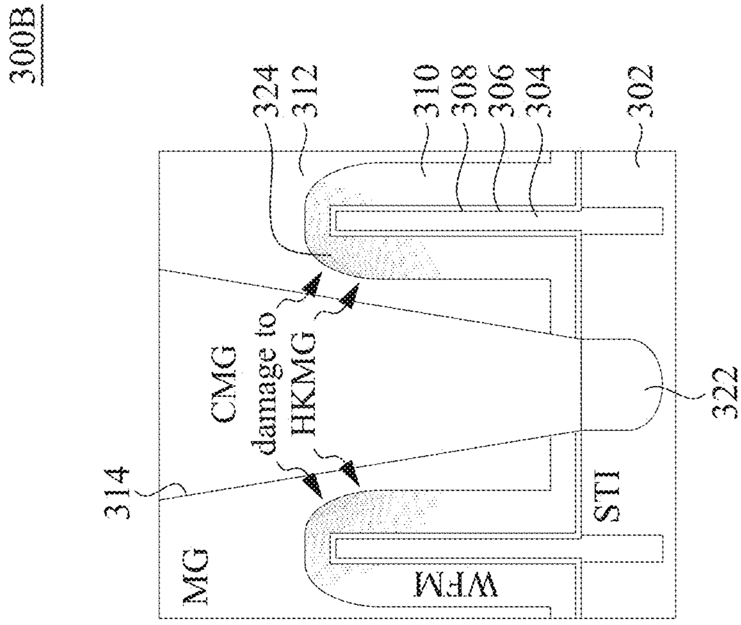
FIGS. 3A and 3B are cross-sectional views of FinFET device structures at an intermediate manufacturing step according to some embodiments.
Figure 3A:
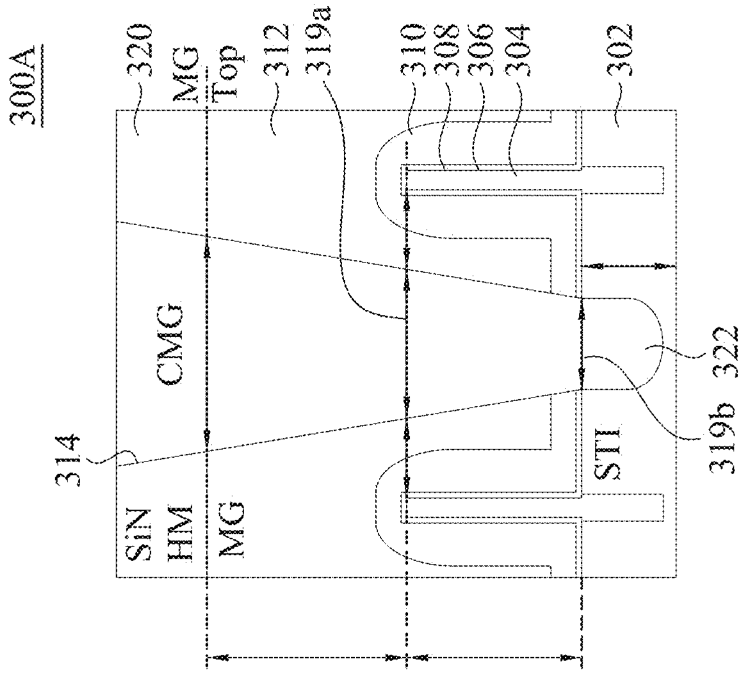

FIG. 3A is a cross-sectional view of FinFET device structures 300A at an intermediate manufacturing step according to some embodiments including a shallow trench isolation (STI) structure 302 (the 3AB numbered elements correspond to the 1AB and 2AB numbered elements discussed above, e.g., 302 corresponds to 102 and 202), a fin structure 304, an interfacial layer 306, a high-x layer 308, a work function metal (WFM) layer 310, and metal gate (MG)

layer 312, and a CMG opening 314 defined by a hard mask (HM) 320. In some embodiments according to FIG. 3A, the CMG opening 314 is formed with non-vertical sidewalls through the metal gate layer 312 and forms a generally hemispherical recess 322 in the STI structure 302. In some embodiments according to FIG. 3A, the non-vertical sidewalls of the CMG opening 314 result in different OS between the CMG opening sidewalls 314 and the WFM layer 310 formed on the fin structure 304 when measured near the top 319*a* of the fin structure 304 or near the bottom 319*b* of the metal gate layer 312.

FIG. 3B is a cross-sectional view of FinFET device structures 300B at an intermediate manufacturing step according to some embodiments including a shallow trench isolation (STI) structure 302, a fin structure 304, an interfacial layer 306, a high-x layer 308, a work function metal (WFM) layer 310, and metal gate (MG) layer 312, and a CMG opening 314. In some embodiments according to FIG. 3B, the CMG opening 314 is formed with non-vertical sidewalls through the metal gate layer 312 and forms a generally hemispherical recess 322 in the STI structure 302. In some embodiments according to FIG. 3B, the non-vertical sidewalls of the CMG opening 314 result in different OS between an adjacent sidewall of the CMG opening 314 and the WFM layer 310 formed on the fin structure 304 and reduce the effective thickness of the metal gate layer 312. The reduced thickness of the metal gate material between the CMG opening and the WFM layer 310 increases the likelihood that the etchant used during the CMG etch will diffuse through the metal gate layer 312 and damage at least an upper portion 324 of the WFM layer 310 and/or the underlying a high-x layer 308, interfacial layer 306, and/or the fin structure 304.

Figure 4C:
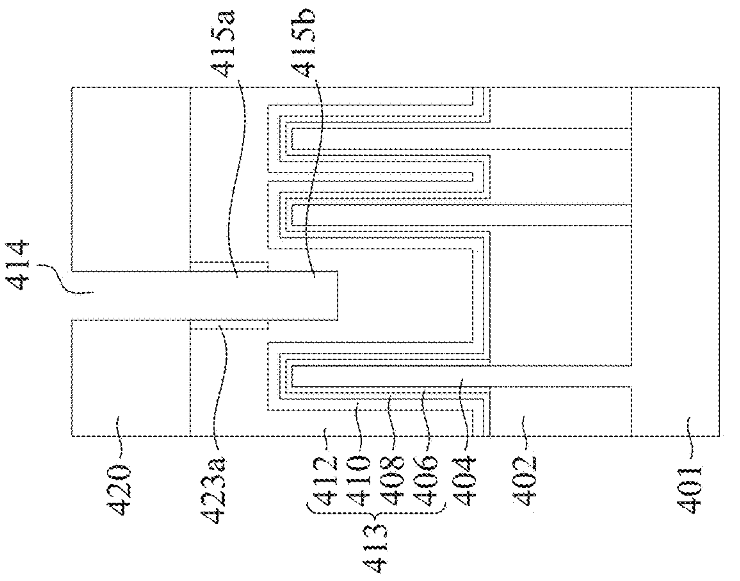
FIGS. 4A to 4H are cross-sectional views of FinFET device structures at a series of intermediate manufacturing steps according to some embodiments.
Figure 4B:
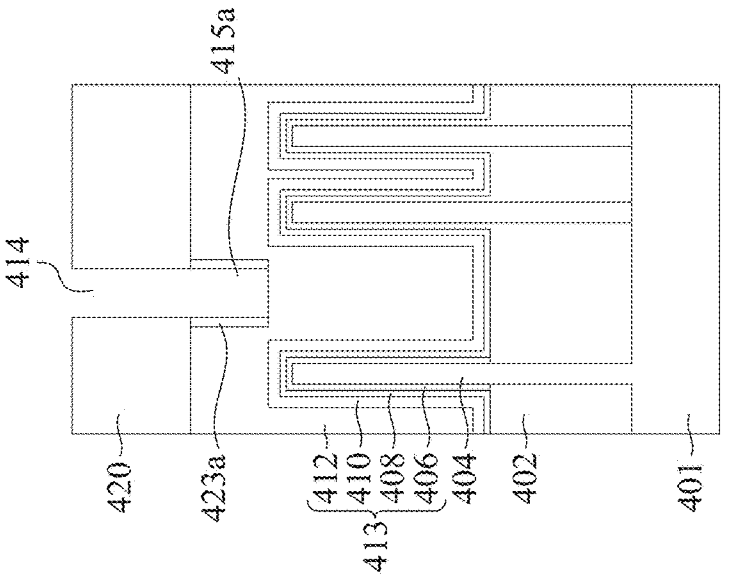
Figure 4A:
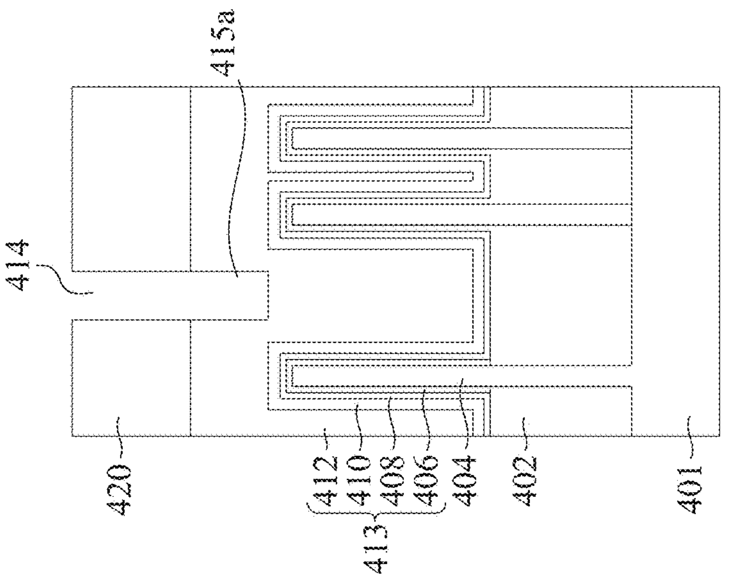

FIG. 4A is a cross-sectional view of FinFET device structures at an intermediate manufacturing step according to some embodiments including a substrate 401, a shallow trench isolation (STI) structure 402 (the 4A-H numbered elements correspond to the 1A-B, 2A-B, and 3A-B numbered elements discussed above, e.g., 402 corresponds to 102, 202, and 302), a fin structure 404, a metal gate (MG) structure 413 formed over the fin structure 404, with, in some embodiments, the MG structure 413 including an interfacial layer 406, a high-κ layer 408, a work function metal (WFM) layer 410, a metal layer 412, and a CMG opening 414 defined by a hard mask 420. In some embodiments according to FIG. 4A, the CMG opening 414 is formed with substantially vertical sidewalls by removing an upper portion 415*a* of the metal layer 412 by controlling the etch process to increase the degree of anisotropy obtained and/or limiting the etch time in order to reduce undercutting while removing only an upper portion 415*a* of the metal layer 412.

FIG. 4B is a cross-sectional view of FinFET device structures at an intermediate manufacturing step performed on the FinFET device structures of FIG. 4A according to some embodiments including a substrate 401, a shallow trench isolation (STI) structure 402, a fin structure 404, a metal gate structure 413, and a CMG opening 414 defined by a hard mask 420 through which an upper portion 415*a* of the metal layer 412 has been removed by a first etching process. In some embodiments according to FIG. 4B, a first (or $N^{th}$) portion of a passivation layer 423*a* is formed on at least the surfaces of the CMG opening 414 exposed by the removal of the upper portion 415*a* of the metal layer 412.

In some embodiments according to FIG. 4B, a first portion of the passivation layer 423*a* is formed by an oxidation and/or nitridation process using source gases selected from a group consisting of dry $NH_3$, $O_3$, $O_2$, or other suitable reactants in order to form at least a first portion of a sidewall passivation layer 423*a* comprising oxide (MG-oxide) and/or nitride (MG-nitride). In some embodiments, the first portion of a passivation layer 423*a* is formed by a wet treatment process utilizing $H_2O_2$ in combination with ozonated deionized (DI) water to in order to form at least a first portion of a sidewall passivation layer 423*a* comprising an oxide (MG-oxide). When forming the first portion of the sidewall passivation layer 423*a* with a wet treatment process, a portion of the remaining MG is consumed in forming the oxide, with the resulting MG-oxide layer extending both above and below a plane defined by the initial CMG opening 414 sidewall surface. In some embodiments, other materials, e.g., nitrides and oxides, exposed to the wet treatment process will form an oxide layer having a reduced thickness relative to the thickness of the MG-oxide layer formed during the same operation, thereby resulting in a less conformal oxide layer being formed over the exposed surfaces.

In some embodiments, the first portion of the passivation layer 423*a* is formed by ALD deposition in order to form at least a first portion of the sidewall passivation layer 423*a* comprising an oxide, nitride, and/or oxynitride of aluminum, titanium, silicon, tungsten and/or other suitable metal or semiconductor including, for example, a first portion of the passivation layer 423*a* comprising $AlO_x$, $AlN_y$, $AlO_xN_y$, $TiO_x$, $TiN_y$, $AlO_xN_y$, $SiO_x$, $SiN_y$, $SiO_xN_y$, WN, $WO_x$, $WO_xN_y$, and alloys and mixtures thereof. When forming the first portion of the sidewall passivation layer 423*a* with an ALD process, a portion of the remaining MG consumed, if any, is reduced in forming the oxide, with the resulting MG-oxide layer extending primarily above planes defined both by the initial MG sidewall surface and other materials and tends to form a thinner, but more conformal oxide layer than the oxide layer achieved with the wet treatment or oxidizing/nitriding processes.

FIG. 4C is a cross-sectional view of FinFET device structures at an intermediate manufacturing step performed on the FinFET device structures of FIG. 4B according to some embodiments including a substrate 401, a shallow trench isolation (STI) structure 402, a fin structure 404, a metal layer 412, and a CMG opening 414 defined by a hard mask 420 through which an intermediate portion 415*b* of the metal layer 412 has been removed by a second etch process, which in some embodiments, uses the same etch chemistry as the first etch process.

In some embodiments, the second etch process utilizes a different etch process than the first etch process with variations in the etch chemistry, power, pressure, and/or duration to remove the intermediate portion 415*b* of the metal layer 412. In some embodiments, the second etch process includes at least first and second combinations of etchant(s), power(s) and/or pressure(s) that are applied sequentially to the intermediate structure of FIG. 4B. In some embodiments, the first combination is tailored for removing the horizontal portion of the first portion of the sidewall passivation layer 423*a* found on the lower surface of the CMG opening 414 created by removing the upper portion 415*a* of the metal layer 412 with the second combination being configured for removing more of the metal layer 412 exposed within CMG opening 414. In some embodiments according to FIG. 4C, the first portion of the sidewall passivation layer 423*a* formed previously remains in place on the sidewall of the CMG opening 414. The residual first portion of the sidewall passivation layer 423*a* acts to prevent or suppress undercutting of the hard mask 420 during the subsequent CMG etch(es) and thereby aids in maintaining the patterned dimension of the CMG opening 414. By preventing undercutting of the hard mask 420, the first portion of the sidewall passivation layer 423*a* maintains a substantially vertical sidewall within the CMG opening 414 and exposes new surfaces of the metal layer 412 and allows for the removal of the intermediate portion 415*b* of the metal layer 412 to further extend CMG opening 414.

Figure 4D:
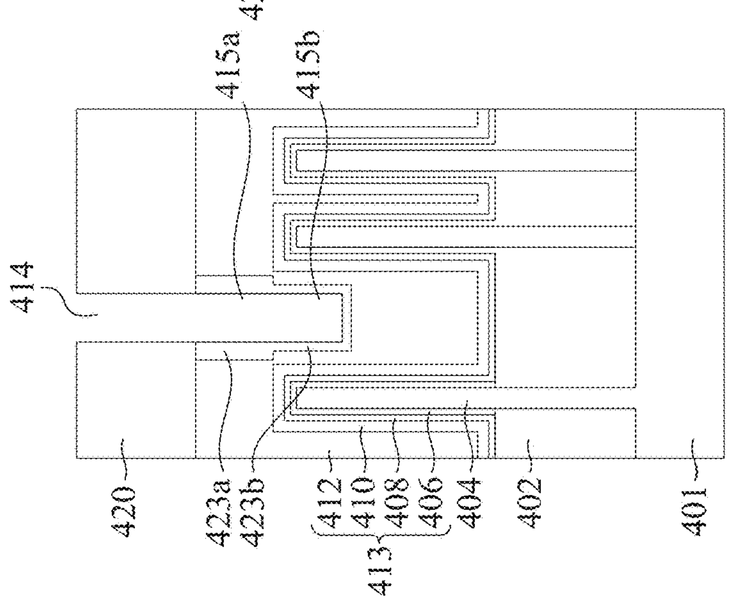

FIG. 4D is a cross-sectional view of FinFET device structures at an intermediate manufacturing step performed on the FinFET device structures of FIG. 4C according to some embodiments including a substrate 401, a shallow trench isolation (STI) structure 402, a fin structure 404, a metal layer 412, and a CMG opening 414 defined by a hard mask 420 through which an intermediate portion 415*b* of the metal layer 412 has been removed. In some embodiments according to FIG. 4D, a second (or N+1$^{th}$) portion of the passivation layer 423*b* is formed on at least the surfaces of the metal layer 412 exposed within the CMG opening 414 by the removal of the intermediate portion 415*b* of the metal layer 412.

In some embodiments according to the embodiments of FIG. 4D, the second (or N+1$^{th}$) of the passivation layer 423*b* is formed by an oxidation and/or nitridation process using suitable source gases, a wet treatment process utilizing $H_2O_2$ in combination with ozonated deionized (DI) water. Because the second portion of the passivation layer 423*b* is being formed over the first portion of the passivation layer 423*a*, the effective thickness of the first portion of the passivation layer 423*a* will be increased accordingly. When using a formation process that consumes a portion of the metal layer 412 in forming the passivation layer, the first portion of the passivation layer 423*a* will tend to extend further both above and below the plane defined by the initial CMG opening 414 sidewall surface. The increased thickness of the first portion of the passivation layer 423*a* relative to the second portion of the passivation layer 423*b* produces a tapered or stepped profile of the passivation layer within the CMG opening 414.

In some embodiments, an ALD deposition process is used for forming an oxide, nitride, and/or oxynitride of one or more suitable metal or semiconductor as detailed above. When forming the second portion of the sidewall passivation layer 423*b* with an ALD process, a portion of the remaining MG consumed, if any, is reduced in forming the oxide, with the resulting MG-oxide layer extending primarily above planes defined both by the initial MG sidewall surface and other materials and tends to form a thinner, but more uniform and conformal oxide layer than the oxide layer achieved using the wet treatment or oxidizing/nitriding processes. Accordingly, in embodiments in which both the first and second portions of the sidewall passivation layer 423*a*, 423*b* are formed using an ALD process, any tapering or stepping in the profile of the sidewall passivation layer will be reduced relative to that achieved using the wet treatment or oxidizing/nitriding processes.

In some embodiments, the second (or N+1$^{th}$) portion of the passivation layer 423*b* is formed by a same process used to form the first (N$^{th}$) portion of the passivation layer 423*a*. In some embodiments, the second (or N+1$^{th}$) portion of the passivation layer 423*b* is formed by a different process from that used to form the first (N$^{th}$) portion of the passivation layer 423*a*.

Figure 4E:
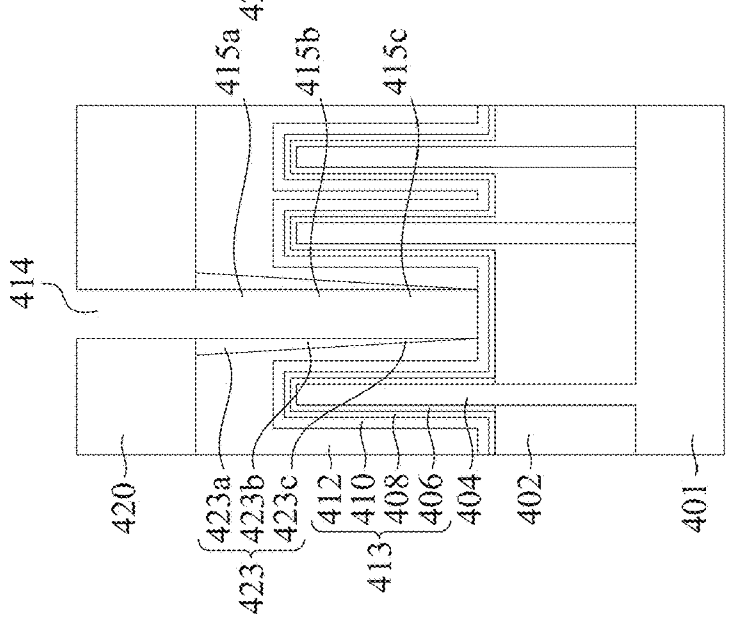

FIG. 4E is a cross-sectional view of FinFET device structures at an intermediate manufacturing step performed on the FinFET device structures of FIG. 4D according to some embodiments including a substrate 401, a shallow trench isolation (STI) structure 402, a fin structure 404, a metal layer 412, and a CMG opening 414 defined by a hard mask 420 through which a lower portion 415*c* of the metal layer 412 has been removed by a third etch process. In some embodiments, the third etch process includes at least first and second combinations of etchant(s), power(s) and/or pressure(s) that are applied sequentially to the intermediate structure of FIG. 4D. In some embodiments, the first combination is tailored for removing the horizontal portion of the second portion of the sidewall passivation layer 423*b* found in the CMG opening 414 formed by removing the intermediate portion 415*b* of metal layer 412 with the second combination being configured for removing more of the MG layer 412 exposed at the bottom of CMG opening 414. In some embodiments, the third etch process is the same etch process used in both the first and second etch processes to remove the upper and intermediate portions 415*a*, 415*b*, of the metal layer 412.

In some embodiments, one or more of the first, second, and third etch processes utilize a different etch process with variations in the etch chemistry, power, pressure, and/or duration to remove the corresponding portion(s) of the metal layer 412. In some embodiments according to FIG. 4E, the passivation layers 423*a*, 423*b* formed previously act to prevent or suppress undercutting of the hard mask 420 and lateral etching of the metal layer 412, thereby helping to maintain the patterned dimension of the CMG opening 414, thereby maintaining a substantially vertical sidewall within the CMG opening 414. In some embodiments according to FIG. 4E, a third (or N+2$^{th}$) passivation layer 423*c* is formed on at least the surfaces of the metal layer 412 exposed within CMG opening 414 by the removal of the lower portion 415*c* of the metal layer 412. When using a formation process that consumes a portion of the metal layer 412 in forming the passivation layer, the increased thickness of the first portion of the passivation layer 423*a* relative to the second portion of the passivation layer 423*b*, and the increased thickness of the second portion of the passivation layer 423*b* relative to the third portion of the passivation layer 423*c* produces a tapered or stepped profile of the passivation layer 423 within the CMG opening 414.

In some embodiments according to the embodiments of FIG. 4E, a third (or N+2$^{th}$) portion of passivation layer 423*c* is formed by an oxidation and/or nitridation process using suitable source gases, a wet treatment process utilizing $H_2O_2$ in combination with ozonated deionized (DI) water, an ALD deposition for forming an oxide, nitride, and/or oxynitride of at least one suitable metal or semiconductor as detailed above. In some embodiments, the third (or N+2$^{th}$) portion of the passivation layer 423*c* is formed by a same process used to form at least one of the second (or N+1$^{th}$) portion of the passivation layer 423*b* or the first (N$^{th}$) portion of the passivation layer 423*a*. In some embodiments, the third (or N+2$^{th}$) portion of the passivation layer 423*c* is formed by a different process from both the second (or N+1$^{th}$) portion of the passivation layer 423*b* and the first (N$^{th}$) portion of the passivation layer 423*a*.

Figure 4F:
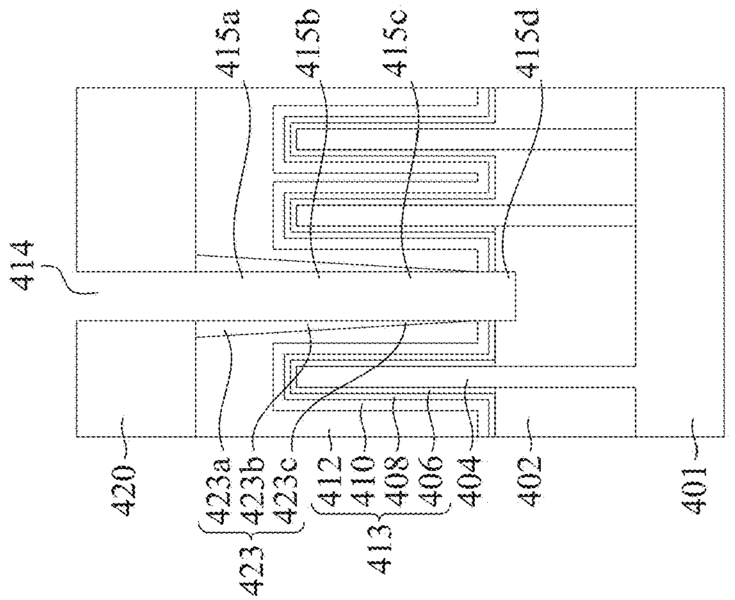

FIG. 4F is a cross-sectional view of FinFET device structures at an intermediate manufacturing step performed on the FinFET device structures of FIG. 4E according to some embodiments including a substrate 401, a shallow trench isolation (STI) structure 402, a fin structure 404, a metal gate (MG) structure 413, and a CMG opening 414 defined by a hard mask 420 through which an upper portion 415*d* of the STI structure 402 has been removed by a fourth etch process. In some embodiments, the fourth etch process parameters will differ from the etch processes of the first, second, and third etch processes with variations in the etch chemistry, power, pressure, and/or duration to more effectively remove the corresponding portion of the STI structure 402 rather than the metal layer 412. In some embodiments, the fourth etch process includes at least first and second combinations of etchant(s), power(s) and/or pressure(s) that are applied sequentially to the intermediate structure of FIG. 4E.

In some embodiments, the first combination is tailored for removing the horizontal portions of any layers between the fin structure 404 and the metal layer 412 including, for example, an interfacial layer 406, a high-κ layer 408, and/or a work function metal (WFM) layer 410 exposed at the lower surface of the CMG opening 414 created by removing the lower portion 415*c* of the metal layer 412 with the second combination being configured for removing material used in forming the STI structure 402 exposed within CMG opening 414. Depending on the etch process conditions utilized during removal of the upper portion 415*d* of the STI structure 402, in some embodiments the opening formed in the STI structure 402 has substantially vertical sidewalls and forms a generally rectangular or cylindrical opening while in some embodiments the opening formed in the STI structure 402 has curved or arcuate profile forming a generally trough or hemispherically-shaped opening. In some embodiments according to FIG. 4F, the passivation layers 423*a*, 423*b*, 423*c* formed previously act to prevent or suppress undercutting of the hard mask 420 and assist in maintaining the patterned dimension of the CMG opening 414, thereby maintaining a substantially vertical sidewall within the CMG opening 414.

In some embodiments according to the embodiments of FIG. 4F, the etch conditions and/or etchant species are modified from those used for etching the overlying portions of the metal layer 412 in order to provide additional dimensional control for the portion of the CMG opening 414 formed within the STI structure 402. In some embodiments according to the embodiments of FIG. 4F the etch conditions and/or etchant species are modified to provide a less anisotropic etch profile within the STI structure 402 and thereby provide for a curved or hemispherical recess (not shown) in the lowest portion of the CMG opening 414. In other embodiments according to the embodiments of FIG. 4F the etch conditions and/or etchant species are modified to provide a generally anisotropic etch profile within the STI structure 402 and thereby provide for a rectangular or cylindrical recess in the lowest portion of the CMG opening 414. In some embodiments according to the embodiments of FIG. 4F, the option for adjusting the etch conditions and/or etchant species when etching the STI structure 402 provides for a reduced depth of the lowest portion of the CMG opening 414 and reduces or eliminates the need for excessive overetch and recess depth.

Figure 4H:
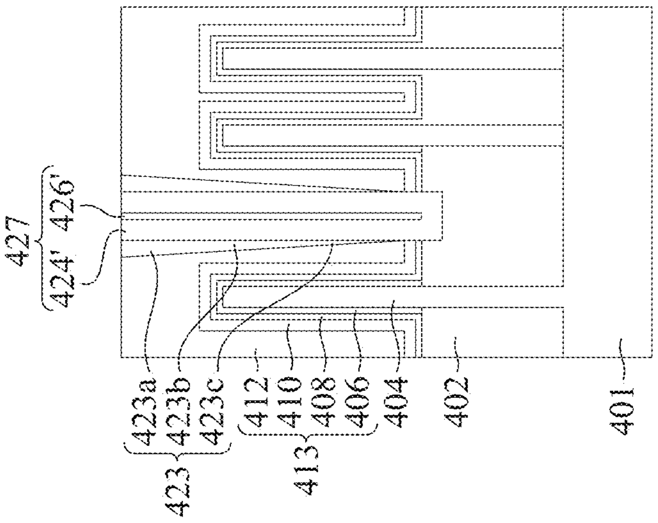
Figure 4G:
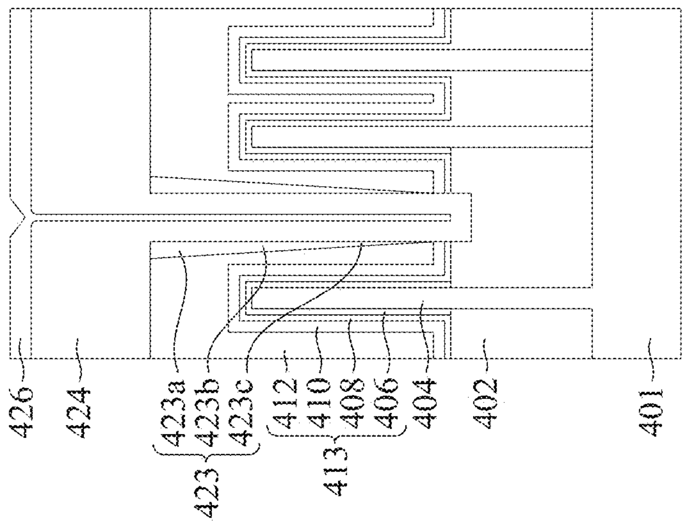

FIG. 4G is a cross-sectional view of FinFET device structures at an intermediate manufacturing step performed on the FinFET device structures of FIG. 4F according to some embodiments. The FinFET device structures include a substrate 401, a shallow trench isolation (STI) structure 402, a fin structure 404, a metal gate (MG) structure 413, and a CMG opening 414 defined by a hard mask 420 through which portions of the underlying metal layer 412 and an upper portion 415*d* of the STI structure 402 have been removed. After the STI removal portion of the fourth etch has been completed to remove the upper portion 415*d* of the STI structure 402 and, in some embodiments, create a preferred profile, the FinFET device structures of FIG. 4F are subjected to an chemical-mechanical planarization (CMP) or etchback process in order to remove the hard mask 420 and expose an upper surface of the metal layer 412. A first CMG dielectric layer 424 is then deposited on the remaining structure to fill the CMG opening 414 using, e.g., an ALD process or other suitable deposition process. In some embodiments, the process of forming the first CMG dielectric layer 424 will not completely fill the CMG opening 414 and will have central opening or slot defined by the first CMG dielectric layer 424. In such embodiments, a second CMG dielectric layer 426 is formed on the first CMG dielectric layer 424 using a process e.g., a plasma enhanced chemical vapor deposition (PECVD) or other suitable process, to complete the filling of the CMG opening 414.

FIG. 4H is a cross-sectional view of FinFET device structures at an intermediate manufacturing step performed on the FinFET device structures of FIG. 4G according to some embodiments. The excess upper portions of the first and second CMG dielectric layers 424, 426 (the portions not filling the CMG opening 414) are then subjected to a CMP or etchback process in order to remove the upper portions of the CMG dielectric layers 424, 426 and expose the upper surfaces of the metal layer 412. The residual portions of the CMG dielectric layer(s) 424', 426' in combination form a CMG dielectric structure 427 that electrically isolates the adjacent portions of the metal gate structure 413 and provides a planarized surface suitable for additional processing.

FIG. 4AB is a cross-sectional view of FinFET device structures at an intermediate manufacturing step performed on the FinFET device structures of FIG. 4A during the process of forming the FinFET device structures of FIG. 4B according to some embodiments. The FinFET structure of FIG. 4AB includes a substrate 401, a shallow trench isolation (STI) structure 402, a fin structure 404, a metal gate structure 413, and a CMG opening 414 defined by a hard mask 420 through which an upper portion 415*a* of the metal layer 412 has been removed by a first etching process. In some embodiments according to FIG. 4A/B, a conformal layer of a passivation material 422*a* is formed on at least the surfaces of the hard mask 420 and CMG opening 414 exposed by the removal of the upper portion 415*a* of the metal layer 412 using, e.g., an ALD process. The passivation material 422*a* has then been subjected to a CMP or etchback process in order to remove the upper portions of the layer of passivation material 422*a* and expose the upper surfaces of the hard mask 420.

FIG. 4B/C is a cross-sectional view of FinFET device structures at an intermediate manufacturing step performed on the FinFET device structures of FIG. 4B during the process of forming the FinFET device structures of FIG. 4C according to some embodiments. The FinFET structure of FIG. 4B/C includes a substrate 401, a shallow trench isolation (STI) structure 402, a fin structure 404, a metal gate structure 413, and a CMG opening 414 defined by a hard mask 420 through which an upper portion 415*a* of the metal layer 412 has been removed by a first etch process. In some embodiments according to FIG. 4B/C, the conformal layer of the passivation material 422*a* has been subjected to a second etch process to remove additional portions of the passivation material 422*a* from the sidewalls of hard mask 420 and the lower surface of the CMG opening 414 to form the first portion of the passivation layer 423*a* on the sidewall of that portion of the CMG opening formed in the metal layer 412. The etch process has also removed an intermediate portion of the metal layer 412 to extend the CMG opening 414 below the first portion of the passivation layer 423*a*.

FIG. 4C/D is a cross-sectional view of FinFET device structures at an intermediate manufacturing step performed on the FinFET device structures of FIG. 4C during the process of forming the FinFET device structures of FIG. 4D according to some embodiments. The FinFET structure of FIG. 4C/D includes a substrate 401, a shallow trench isolation (STI) structure 402, a fin structure 404, a metal gate structure 413, and a CMG opening 414 defined by a hard mask 420 through which upper and intermediate portions 415*a*, 415*b* of the metal layer 412 have been removed by first and second etching processes. In some embodiments according to FIG. 4C/D, a conformal layer of a passivation material 422*b* is formed on at least the surfaces of the hard mask 420, the first portion of the passivation layer 423*a*, and the CMG opening 414 exposed by the removal of the intermediate portion 415*b* of the metal layer 412 using, e.g., an ALD process. The passivation material 422*b* has then been subjected to a CMP or etchback process in order to remove the upper portions of the layer of passivation material 422*a* and expose the upper surfaces of the hard mask 420. The presence of the layer of passivation material formed over first portion of the passivation layer 423*a* increases the effective thickness of the first portion of the passivation layer 423*a* and provides for a tapered profile in the final passivation layer 423.

FIG. 4D/E is a cross-sectional view of FinFET device structures at an intermediate manufacturing step performed on the FinFET device structures of FIG. 4D during the process of forming the FinFET device structures of FIG. 4E according to some embodiments. The FinFET structure of FIG. 4D/E includes a substrate 401, a shallow trench isolation (STI) structure 402, a fin structure 404, a metal gate structure 413, and a CMG opening 414 defined by a hard mask 420 through which upper and intermediate portions 415*a*, 415*b* of the metal layer 412 have been removed by a first and second etch processes. In some embodiments according to FIG. 4D/E, the conformal layer of the passivation material has been subjected to an etch process to remove additional portions of the passivation material from the sidewalls of hard mask 420 and the lower surface of the CMG opening 414 to form the second portion of the passivation layer 423*b* on the sidewall of that portion of the CMG opening formed in the metal layer 412 below the first portion of the passivation layer 423*a*. The etch process has also removed an intermediate portion of the metal layer 412 to extend the CMG opening 414 below the second portion of the passivation layer 423*b*, with the differences in the thicknesses of the first and second portions of the passivation layer 423*a*, 423*b*, forming a tapered or stepped profile.

FIG. 4E/F is a cross-sectional view of FinFET device structures at an intermediate manufacturing step performed on the FinFET device structures of FIG. 4E during the process of forming the FinFET device structures of FIG. 4F according to some embodiments. The FinFET structure of FIG. 4D/E includes a substrate 401, a shallow trench isolation (STI) structure 402, a fin structure 404, a metal gate structure 413, and a CMG opening 414 defined by a hard mask 420 through which upper, intermediate, and lower portions 415*a*, 415*b*, 415*c* of the metal layer 412 have been removed by first, second, and third etch processes and first, second, and third conformal layers have been sequentially applied to the deepening CMG opening 414. The first, second, and third conformal layers have then been partially removed to form first, second, and third portions of the passivation layer 423*a*, 423*b*, 423*c*. In some embodiments, the differences in the thicknesses of the first, second, and third portions of the passivation layer 423*a*, 423*b*, 423*c*, in turn, cooperate to form a sidewall passivation layer 423 having a tapered or stepped profile that extends along the sidewall of CMG opening 414.

In some embodiments according to FIG. 4E/F, a third conformal layer of the passivation material has been subjected to an etch process to remove additional portions of the passivation material from the sidewalls of hard mask 420 and the lower surface of the CMG opening to form the third portion of the passivation layer 423*c* on the sidewall of that portion of the CMG opening formed in the metal layer 412 below the first and second portions of the passivation layer 423*a*, 423*b*. The etch process has also removed both any additional layers found between the lower surface of the metal layer 412 and the upper surface of the underlying STI structure 402, and an upper portion of the STI structure 402 to extend the CMG opening 414 into the STI structure 402 below the third portion of the passivation layer 423*c*.

Figure 5B:
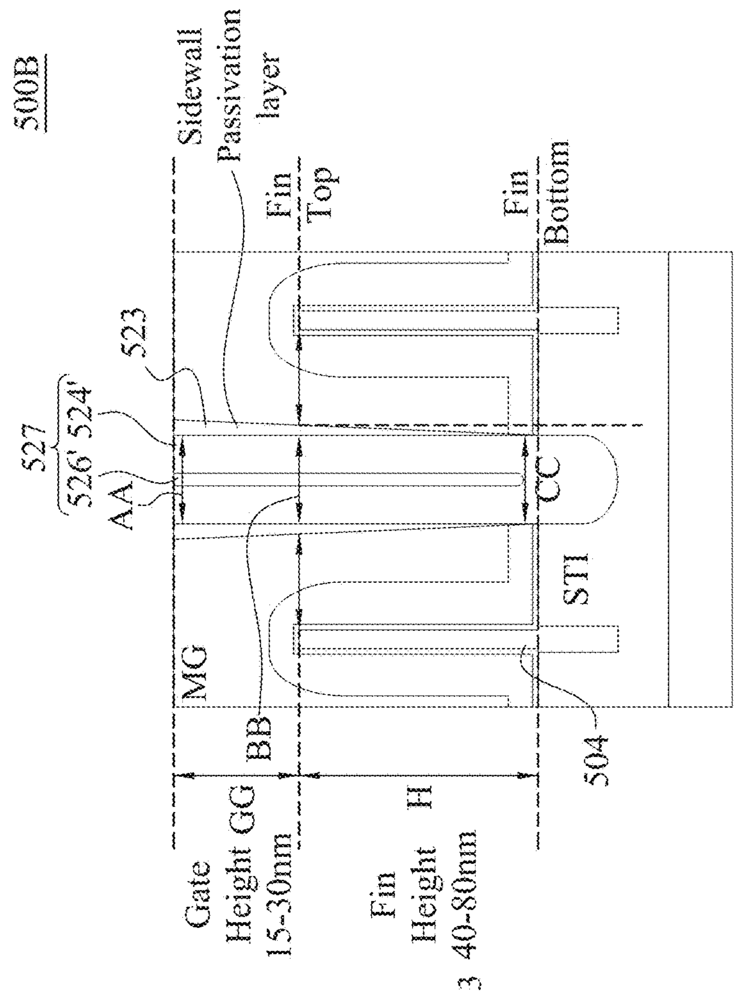
FIG. 5B is a cross-sectional view of a FinFET device structure at an intermediate manufacturing step subsequent to the intermediate manufacturing step of FIG. 5A according to some embodiments with relevant dimensions marked.
Figure 5A:
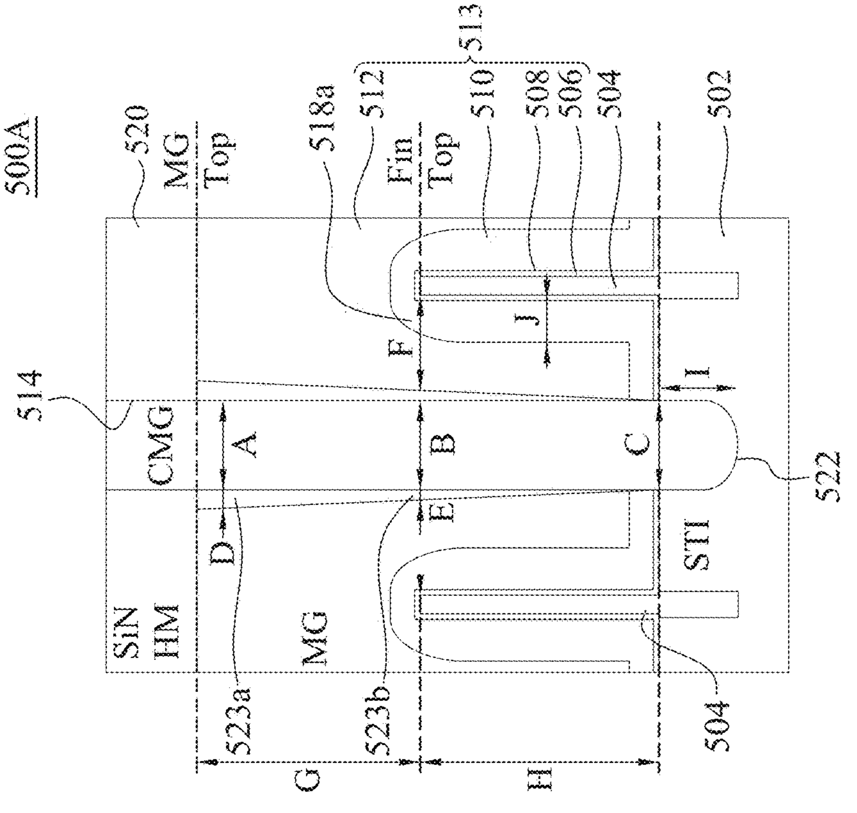
FIG. 5A is a cross-sectional view of a FinFET device structure at an intermediate manufacturing step according to some embodiments with relevant dimensions marked.

FIG. 5A is a cross-sectional view of FinFET device structures 500A at an intermediate manufacturing step according to some embodiments including a shallow trench isolation (STI) structure 502 (the 5A-B numbered elements correspond to the 1A-B, 2A-B, 3A-B and 4A-B numbered elements discussed above, e.g., 502 corresponds to 102, 202, 303, and 402), a fin structure 504, an interfacial layer 506, a high-x layer 508, a work function metal (WFM) layer 510, and metal gate (MG) layer 512, and a CMG opening 514 defined by a hard mask (HM) 520. In some embodiments according to FIG. 5A, the CMG opening 514 is formed with substantially vertical sidewalls through the metal gate layer 512 and forms a generally hemispherical recess 522 in the STI structure 502. In some embodiments according to FIG. 5A, the substantially vertical sidewalls of the CMG opening 514 have a sidewall taper of no more than 2% from vertical.

FIG. 5B is a cross-sectional view of FinFET device structures 500B at an intermediate manufacturing step according to some embodiments including a shallow trench isolation (STI) structure 502, a fin structure 504, an interfacial layer 506, a high-K layer 508, a work function metal (WFM) layer 510, and metal layer 512, with the interfacial layer 506, the high-K layer 508, the work function metal (WFM) layer 510, and metal layer 512 cooperating to form a metal gate structure 513, and a CMG opening 514. In some embodiments according to FIG. 5B, the hard mask (not shown) is removed and CMG opening 514 is filled with a first CMG dielectric layer (not shown) and, in some embodiments, a second CMG dielectric layer (not shown). The first and (optional) second CMG dielectric layers are then planarized to remove the upper portion(s) of the dielectric layers with the residual portion of the first CMG dielectric layer 524' and, if present, a residual portion of the second CMG dielectric layer 526', to form a CMG dielectric structure 527 that provides electrical isolation of the metal gate structures on opposite sides of the CMG dielectric structure 527. As with the CMG opening 514, in some embodiments, the CMG dielectric structure 527 has substantially vertical sidewalls having a sidewall taper of no more than 2% from vertical. In some embodiments, the CMG dielectric structure 527 sidewall taper may be no more than 5% from vertical while in other embodiments, the CMG dielectric structure 527 may have a "stepped" sidewall configuration corresponding to the passivation layer 523 that was provided on the sidewall of the CMG opening.

Certain relevant dimensions are also shown in FIGS. 5A and 5B including, the CMG opening (top) (A), CMG opening (middle/fin) (B), and CMG opening (bottom) (C) and the corresponding upper (AA), middle (BB), and bottom (CC) CMG dielectric structure 527 widths after the CMG opening is filled with the CMG dielectric structure. Other relevant dimensions include the thickness of the first and second (or $N^{th}$ and $N+1^{th}$) passivation layers 523*a* (D) and 523*b* (E), the top offset spacing 518*a* (F), the MG layer 312 thickness pre-CMP (G) and post-CMP (GG) above the top of the fin 504, the fin 504 height (H) above the STI structure 502, the depth (I) of the recess 522 formed in the STI structure 502, and the thickness of the work function metal 510 (J). Target ranges for these relevant dimensions using current designs and manufacturing processes include the values provided in TABLE 1 below.

TABLE 1

| Dimension (Designator) | Range |
|---|---|
| Upper CMG opening (A) | 16-34 nm |
| Middle CMG opening (B) | 14-32 nm |
| Bottom CMG opening (C) | 13-32 nm |
| Upper CMG dielectric width (AA) | 16-34 nm |
| Middle CMG dielectric width (BB) | 14-32 nm |
| Bottom CMG dielectric width (CC) | 13-32 nm |
| Upper Portion Passivation Layer (D) | 1-5 nm |
| Middle Portion Passivation Layer (E) | 0.8-4 nm |
| Offset Spacing (OS) (at top of fin) (F) | 10-25 nm |
| MG Thickness above Fin (G) (pre CMP) | 30-85 nm |
| MG Thickness above Fin (GG) (post CMP) | 15-30 nm |
| Fin Height (H) | 40-80 nm |
| Depth of STI recess (I) | 0-15 nm |
| Work Function Metal Thickness (J) | 6-20 nm |

Departures from the target values for these dimensions will tend to degrade the yield, performance, and/or reliability for the resulting IC devices. For example, offset spacing (F) and STI recess depth (I) values that are above or below the target values are associated with reduced manufacturing yields, shifted $V_t$ values, and/or increased N+ to N-well current leakage. Variations in the remaining are also associated with increased device performance variability and/or reduced reliability.

Figure 5D:
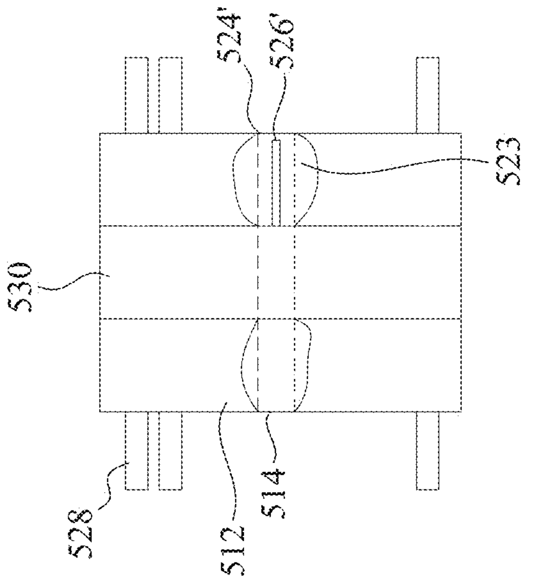
FIG. 5D is plan view of the FinFET device structure of FIG. 5B according to some embodiments.
Figure 5C:
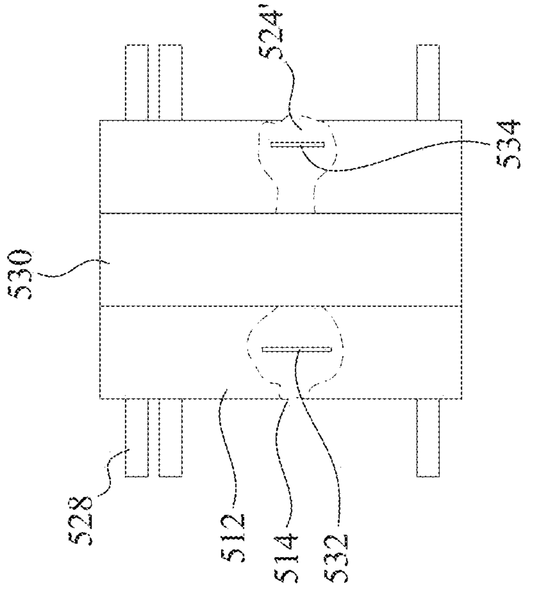
FIG. 5C is a plan view of the FinFET device structure of FIG. 5B according to some embodiments without the benefit of the passivation layer.

FIG. 5C is a plan view generally corresponding to the FinFET device structure 500B of FIG. 5B in which a series of CMG openings 514 were defined by a hard mask 520 (not shown) and etched to remove the metal layer 512 from the exposed regions of the metal gate structures in regions separated by an ILD 530 and form a CMG opening 514 within an active area defined by dielectric structures 528. The etch process used in forming the FinFET device structure of FIG. 5C does not incorporate the step-wise etching and passivation layer formation as detailed above in connection with the description of FIGS. 4A-4H. In the absence of the passivation layer, the dimension control of the CMG opening is reduced relative to that achieved with the FinFET structure of FIG. 5B, resulting in more variation in both the CMG opening 514 and the CMG dielectric structure 524' and an increased likelihood of forming voids 532, 534, in the upper surface of the CMG dielectric structure 524'.

FIG. 5D is a plan view of the FinFET device structure 500B of FIG. 5B in which a series of CMG openings 514 were defined by a hard mask 520 (not shown) and etched, using a plurality of N etch steps, to remove the metal layer 512 from the exposed regions of the metal gate structure 513 and form CMG opening 514 within an active area and between fin structures 528. The stepwise etch steps are continued until an upper portion of the underlying STI structure is exposed and, in some embodiments, removed. As detailed above in connection with the description of FIGS. 4A-4H, a passivation layer 523 is provided on portions of the sidewall of the CMG opening 514. The passivation layer 523 comprises the combination of each of the incremental passivation layers 523*a*, 523*b*, . . . $\mathbf{523}_{N\text{-}x}$ (not shown) formed on the newly exposed sidewalls of the incremental CMG openings 514 after each of at least the initial N-x etch steps. In some embodiments, the value of x is no greater than 3 and is, more typically, 1 or 2.

In some embodiments, the CMG opening 514 is then filled by depositing a first dielectric material layer knot shown) that is then etched back or planarized to form a dielectric plug including a portion of first dielectric material layer 524' within the CMG opening. The passivation layer 523 provides increased dimensional control of the CMG opening 514 and reduces or eliminates the formation of voids in the dielectric material 524'. In some embodiments, the deposition of the first dielectric material layer is deliberately terminated before the CMG opening 514 is filled completely. In such embodiments, a second dielectric material layer (not shown) is deposited in order to fill the CMG opening 514 completely and then etched back or planarized with the first dielectric material layer to form a second dielectric portion 526' of the dielectric plug.

Figure 6A:
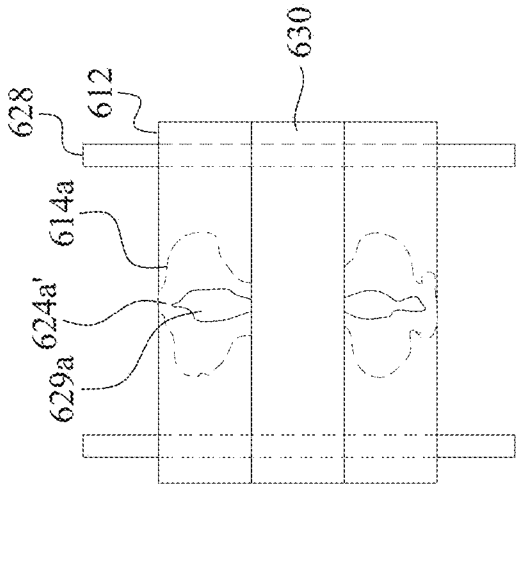
FIG. 6A is a plan view of a FinFET device structure at an intermediate manufacturing step according to some embodiments.

FIG. 6A is a plan view of a FinFET device structure according to some embodiments at an intermediate manufacturing step after the hard mask has been removed to expose upper surfaces of the residual portions of both metal layers 612 extending over fin structures 628 and an inter-layer dielectric (ILD) region 630 within an active area defined by dielectric (OD) structures in which the passivation layer detailed above was not used. The absence of the passivation layer results in reduced dimensional control in the formation of the CMG opening 614*a*, and, in some embodiments, when filled with at least one dielectric material and planarized to form a CMG dielectric structure 624*a*', results in one or more voids 629*a* in the dielectric CMG structure. In some embodiments, the fill material comprises at least one layer of a dielectric material while, in other embodiments, the fill material comprises layers of at least two distinct dielectric materials. In some embodiments, a first dielectric material 624*a*' is utilized for filling an initial portion of the CMG opening 614*a* with a second dielectric material being utilized for filling any voids in the first dielectric material 624*a*'. However, without the passivation layer, the profile of the CMG opening 614*a* lacks the substantially vertical sidewalls that, as detailed above, are achieved using a composite passivation layer. Consequently, the dielectric fill material 624*a*' deposited in the CMG openings 614*a* tends to exhibit void(s) 629*a* that will tend to reduce the yield and/or reliability of the resulting IC devices.

Figure 6B:
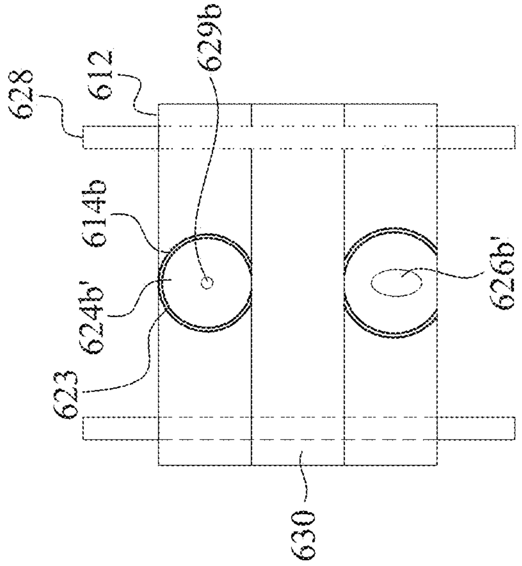
FIG. 6B is a plan view of a FinFET device structure at an intermediate manufacturing step according to some embodiments.

FIG. 6B is a plan view of a FinFET device structure at an intermediate manufacturing step according to some embodiments in which a passivation layer 623 was used to protect the sidewalls of the CMG openings 614*b* after the hard mask has been removed to expose the metal gate layer 612 and the ILD region 630 between adjacent fin structures 628. In some embodiments, the final CMG openings 614*b* is filled with at least a first dielectric fill material 624*b*'. In some embodiments, the CMG dielectric fill material comprises a first layer of a dielectric material while, in other embodiments, the CMG dielectric structure comprises layers of at least first and second distinct dielectric materials (not shown). However, with the inclusion of the passivation layer 623, the profile of the CMG openings 614*b* tend to exhibit substantially vertical sidewalls and improved dimensional control relative to CMG openings produced without benefit of the passivation layer as shown in FIG. 6A. Consequently, after planarization, the portion of the first dielectric fill material 624*b*' remaining in the CMG openings 614*b* tends to exhibit few, if any, voids 629*b* and, if present, the voids are generally smaller and more centrally located relative to the voids in the residual portion of the first dielectric fill material 624*a*' of FIG. 6A. The reduced size of the voids 629*b* relative to the void(s) 629*a* of FIG. 6A tends to improve the yield and/or reliability of the resulting IC devices. In some instances, voids in the residual portion of dielectric fill material 624*b*' may be filled with a second dielectric fill material (not shown) that is planarized in conjunction with the first dielectric fill material (not shown) to form in the CMG dielectric structure.

Figure 7A:
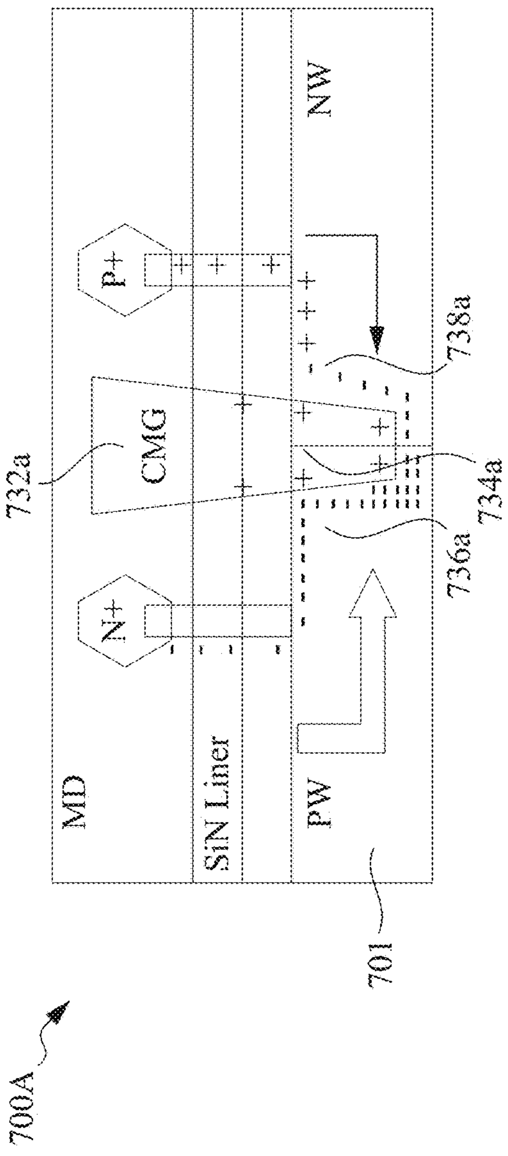
FIGS. 7A and 7B are cross-sectional views of FinFET device structures at an intermediate manufacturing step according to some embodiments.

FIG. 7A is a cross-sectional view of a FinFET device structure 700A at an intermediate manufacturing step according to some embodiments without use of a passivation layer after the final CMG openings have been filled with a fill material. The FinFET structure 700A includes both P-well (PW) and N-well (NW) regions in the substrate, a silicon nitride (SiN) Liner and, over the SiN Liner, a middle dielectric (MD) layer. The fill material includes both a first or upper portion 732*a* of the fill material that extends through an opening in gate metal layer and a second or lower portion 734*a* of the fill material that extends into a recess formed in the substrate material 701. Because the fill material extends into the substrate material between fin structures comprising both n-channel and p-channel devices, in some embodiments, overetching the substrate material will increase the carrier charge density in both n-well and p-well regions 736*a*, 738*a* adjacent the lower portion 734*a* of the fill material. This increased carrier charge density is associated with increased leakage between the N+ regions and the n-well (NW) regions and degrade the performance of the IC devices.

Figure 7B:
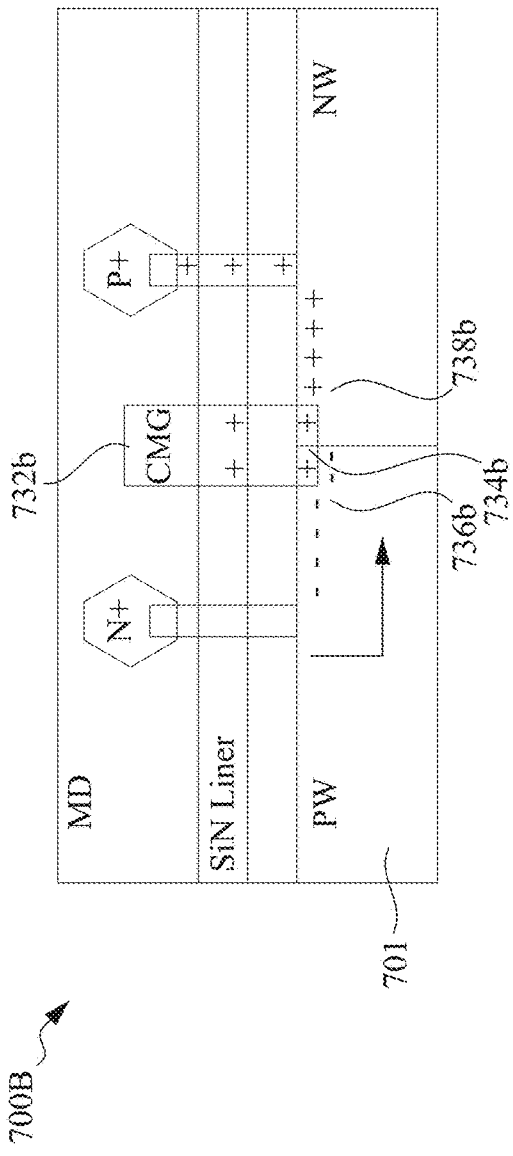

FIG. 7B is a cross-sectional view of a FinFET device structure 700B at an intermediate manufacturing step according to some embodiments which use a passivation layer in the CMG openings after the final CMG openings have been filled with a fill material. The FinFET structure 700B includes both P-well (PW) and N-well (NW) regions in the substrate, a silicon nitride (SiN) Liner and, over the SiN Liner, a middle dielectric (MD) layer. The fill material includes both a first or upper portion 732*b* of the fill material that extends through an opening in gate metal layer and a second or lower portion 734*b* of the fill material that extends into a recess formed in the substrate material 701. Because the use of the passivation layer in the CMG openings improves the configuration of the CMG openings, the depth of the recess and, correspondingly, the depth to which the fill material extends into the substrate material between fin structures comprising both n-channel and p-channel devices is better controlled. In some embodiments the depth of the recess is less than 15 nm and, for some embodiments, will approach 0 nm. The improved control and the reduced intrusion into the substrate material tends to reduce the carrier charge density both in n-well and p-well regions 736*b*, 738*b* adjacent the lower portion 734*b* of the fill material. This reduced carrier charge density is associated with reduced leakage between the N+ regions and the n-well (NW) regions and improves the performance of the IC devices.

FIG. 8 is a flowchart of a method 800 of manufacturing a FinFET device according to some embodiments that includes, in order, the operations of depositing at least one initial layer (e.g., a metal layer or a composite metal gate structure), operation 802. In some embodiments the initial layer includes a plurality of layers selected from the group consisting of an interfacial layer, a high-κ layer, a work function metal (WFM) layer, and metal gate (MG) layer.

The deposition of the initial layer is followed by patterning the initial layer(s), operation 804, using a hard mask configured with one or more materials selected for the resistance to the subsequent etching processes. In some embodiments the patterning operation includes depositing a hard mask layer selected from oxides, nitrides, and/or oxynitrides, forming a photoresist pattern on the hard mask layer, and removing the exposed portions of the hard mask layer with a mask etch, thereby forming a hard mask pattern that is resistant to the etch process(es) that will subsequently be used for removing the initial layer(s).

Once the etch pattern (hard mask) is in place, a first (or $N^{th}$) portion of the initial layer(s) is etched using a first (or $N^{th}$) etch process thereby removing an upper portion of the initial layer(s) and forming a first (or $N^{th}$) opening that extends only partially through the initial layer(s), operation 806.

Once the first opening has been formed, a first passivation layer is formed or deposited, operation 808, on the sidewalls of the first opening formed in the etched portion of the initial layer(s). In some embodiments, the passivation layer is formed by an oxidation and/or nitridation process using source gases selected from a group consisting of dry $NH_3$, $O_3$, $O_2$, or other suitable reactants in order to form an oxide (MG-oxide) and/or a nitride (MG-nitride) passivation layer(s). In some embodiments, the passivation layer is formed using a wet treatment process utilizing $H_2O_2$ in combination with ozonated deionized (DI) water to in order to form an oxide (MG-oxide) passivation layer. In some embodiments, the passivation layer is formed by ALD deposition in order to form an oxide, nitride, and/or oxynitride of aluminum, titanium, silicon, tungsten and/or other suitable metal or semiconductor.

The progress of the etching process is monitored to determine whether the etching of the initial layer(s) is complete, operation 810.

When the etch process is determined not to be complete at operation 810, i.e., the etch process has not yet removed all of the initial layer(s) from the opening, another etch of the residual portion of the initial layer(s), operation 812, is conducted using a second (or $N^{th}$+1) etch process. In some embodiments, the second (or $N^{th}$+1) etch process uses the same etch chemistry as the first etch process. In some embodiments, the second (or $N^{th}$+1) etch process utilizes a different etch process than the first etch process with variations in the etch chemistry, power, pressure, and/or duration to remove an additional portion of the initial layers and increase the depth of the first (or subsequent) opening.

When an additional etching of operation 812 has been completed and the first opening has been extended to form a second (or $N^{th}$+1) opening, which is deeper than the first (or $N^{th}$) opening, an additional passivating operation 814, is conducted to form a second (or $N^{th}$+1) passivation layer on both the first (or $N^{th}$) passivation layer and the newly exposed sidewalls of the second (or $N^{th}$+1) opening within the initial layer(s). In some embodiments, the second (or $N^{th}$+1) passivation process uses the same deposition/formation process as the first (or $N^{th}$) passivation process. In some embodiments, the second (or $N^{th}$+1) passivation process utilizes a different deposition/formation process than the first (or $N^{th}$) passivation process with variations in the source chemistry, power, pressure, and/or duration to deposit/form an additional portion of the passivation layer(s) and increase the protection for the sidewalls of the second (or $N^{th}$+1) opening during further processing and, in particular, subsequent etch processes.

Once the etch processing of operations 806 and/or 812 has reached the predetermined endpoint, the wafer will be advanced to the next operation in the corresponding semiconductor process flow, operation 816.

Optional operations in some embodiments include, depending on the IC device design, a programming operation, operation 818, for setting the functionality of the IC device.

Optional operations in some embodiments include, a test/packaging operation, operation 820, during which the IC device is tested for compliance with predetermined functionality and performance parameters and/or packaged for use in manufacturing or repairing electronic devices.

Figure 9A:
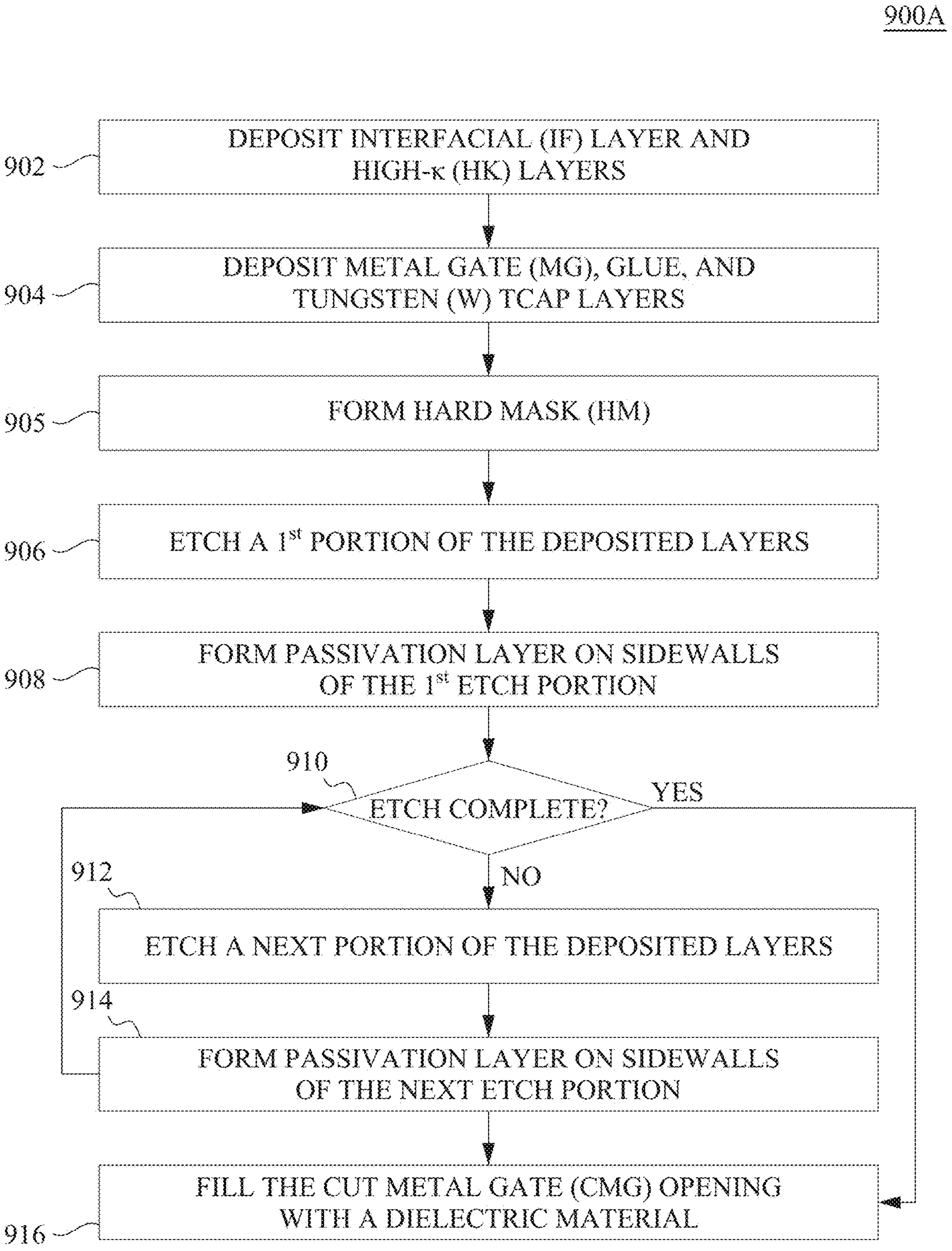
FIGS. 9A and 9B are flowcharts of methods of manufacturing a FinFET device according to some embodiments.

FIG. 9A is a flowchart of a method 900A of manufacturing a FinFET device according to some embodiments that includes, in order, the operations of depositing an interfacial layer and a high-κ layer and, optionally, a work function metal (WFM) layer, on the fin structure, operation 902.

After modification of the fin structure has been completed, a metal gate layer, and, in some embodiments, a glue, or adhesion/seed layer and/or a tungsten cap layer, are deposited on the fin structure, operation 904.

Once the metal gate layer has been deposited, an etch mask is formed on the metal gate layer, operation 905, using a hard mask configured with one or more materials selected for the resistance to the subsequent etching processes. In some embodiments the patterning operation includes depositing a hard mask layer selected from oxides, nitrides, and/or oxynitrides, forming a photoresist pattern on the hard mask layer, and removing the exposed portions of the hard mask layer with a mask etch, thereby forming a hard mask pattern that is resistant to the etch process(es) that will subsequently be used for removing the initial layer(s).

Once the hard mask is in place, a first (or $N^{th}$) portion of the deposited layers is etched using a first (or $N^{th}$) etch process thereby removing an upper portion of the deposited layers and forming a first opening that extends only partially through the deposited layers, operation 906.

A first passivation layer is then formed/deposited on the sidewalls of the first (or $N^{th}$) opening in the etched portion of the metal gate layer(s), operation 908. In some embodiments, the passivation layer is formed by an oxidation and/or nitridation process using source gases selected from a group consisting of dry $NH_3$, $O_3$, $O_2$, or other suitable reactants in order to form an oxide (MG-oxide) and/or a nitride (MG-nitride) passivation layer(s). In some embodiments, the passivation layer is formed using a wet treatment process utilizing $H_2O_2$ in combination with ozonated deionized (DI) water to in order to form an oxide (MG-oxide) passivation layer. In some embodiments, the passivation layer is formed by ALD deposition in order to form an oxide, nitride, and/or oxynitride of aluminum, titanium, silicon, tungsten and/or other suitable metal or semiconductor.

The progress of the etching process is monitored to determine whether the etching of the metal gate layer is complete, operation 910.

When the etch is determined to be incomplete at operation 910, i.e., the etch process has not yet removed all of the metal gate layer from the opening, another etch of the residual portion of the metal gate layer, operation 912, is conducted using a second (or $N^{th}$+1) etch process. In some embodiments, the second (or $N^{th}$+1) etch process uses the same etch chemistry as the first (or $N^{th}$) etch process. In some embodiments, the second (or $N^{th}$+1) etch process utilizes a different etch process than the first (or $N^{th}$) etch process with variations in the etch chemistry, power, pressure, and/or duration to remove an additional portion of the metal gate layer and increase the depth of the first (or $N^{th}$) or subsequent (or $N^{th}$+x) opening, wherein x is an integer from 1 to 10.

When an additional etching of operation 912 has been completed and the first opening has been extended to form a second (or $N^{th}$+1) opening, which is deeper than the first opening, an additional passivating operation 914, is conducted to form another passivation layer on both the first passivation layer and the newly exposed sidewalls of the second (or $N^{th}$+1) opening within the initial layer(s). In some embodiments, the additional (or $N^{th}$+y) passivation process(es), wherein y is an integer between 2 and 10, uses/use the same deposition/formation process(es) as the first passivation process. In some embodiments, the additional or ($N^{th}$+y) passivation process utilizes a different deposition/formation process(es) than the first (or $N^{th}$) passivation process with variations in the source chemistry, power, pressure, and/or duration to deposit/form an additional portion of the passivation layer(s) and increase the protection for the sidewalls of the second (or $N^{th}$+1) or additional (or $N^{th}$+y) opening(s) during further processing and, in particular, subsequent etch processes.

Once the etching/passivation processes have reached the predetermined endpoint, the wafer will be advanced to a refill deposition operation, operation 916, during which the CMG opening will be filled with one or more suitable filler materials.

Figure 9B:
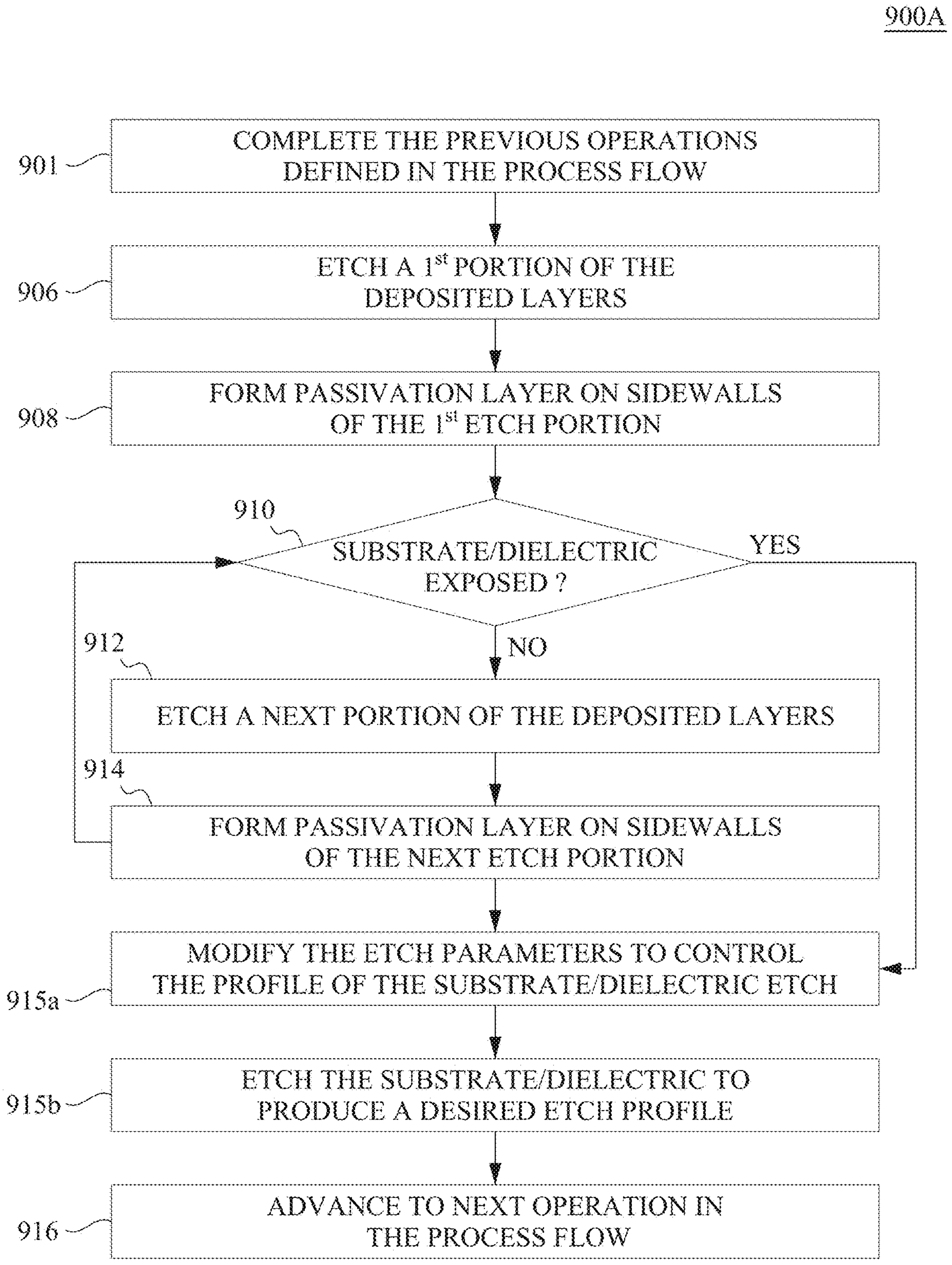

FIG. 9B is a flowchart of a method 900B of manufacturing a FinFET device according to some embodiments that includes, in order, the operations of completing all previous operations defined by the process flow 901 to reach an etch operation.

A first (or $N^{th}$) portion of one or more previously deposited layer(s) is then removed with a first etch process, operation 906, to form a first (or $N^{th}$) opening.

A passivation layer is then formed on the sidewalls of the etched portion of the metal gate layer(s), the first (or $N^{th}$) opening, operation 908. In some embodiments, the passivation layer is formed by an oxidation and/or nitridation process using source gases selected from a group consisting of dry $NH_3$, $O_3$, $O_2$, or other suitable reactants in order to form an oxide (MG-oxide) and/or a nitride (MG-nitride) passivation layer(s). In some embodiments, the passivation layer is formed using a wet treatment process utilizing $H_2O_2$ in combination with ozonated deionized (DI) water to in order to form an oxide (MG-oxide) passivation layer. In some embodiments, the passivation layer is formed by ALD deposition in order to form an oxide, nitride, and/or oxynitride of aluminum, titanium, silicon, tungsten and/or other suitable metal or semiconductor.

The progress of the etching process is monitored to determine whether the etching of the metal gate layer is complete, operation 910.

When the etch is determined to be incomplete at operation 910, i.e., the first (or $N^{th}$) etch process has not yet removed all of the metal gate layer from the opening, another etch of the residual portion of the metal gate layer, operation 912, is conducted using a second (or $N^{th}$+1) etch process. In some embodiments, the second (or $N^{th}$+1) etch process uses the same etch chemistry as the first etch process. In some embodiments, the second (or $N^{th}$+1) etch process utilizes a different etch process than the first etch process with variations in the etch chemistry, power, pressure, and/or duration to remove an additional portion of the metal gate layer and increase the depth of the first (or subsequent) opening.

When an additional etching of operation 912 has been completed and the first opening has been extended to form a second (or $N^{th}+1$) opening, which is deeper than the first opening, an additional passivating operation 914, is conducted to form another passivation layer on both the first passivation layer and the newly exposed sidewalls of the second (or $N^{th}+1$) opening within the initial layer(s). In some embodiments, the second (or $N^{th}+1$) or additional (or $N^{th}+y$), wherein y is an integer between 2 and 10, passivation process uses the same deposition/formation process as the first passivation process. In some embodiments, the second (or $N^{th}+1$) or additional (or $N^{th}+y$) passivation process(es) utilize a different deposition/formation process than the first passivation process with variations in the source chemistry, power, pressure, and/or duration to deposit/form an additional portion of the passivation layer(s) and increase the protection for the sidewalls of the second (or $N^{th}+1$) opening during further processing and, in particular, subsequent etch processes.

Once the etching/passivation processes have reached the predetermined endpoint, e.g., an underlying dielectric structure or substrate has been exposed, at operation 915*a*, the etch parameters are modified from those used in etching the metal gate layer to obtain modified etch parameters that provide for an increased removal rate of the exposed dielectric/substrate material relative to the removal rate of the metal gate layer and/or the passivation layer(s).

The exposed dielectric/substrate material is then etched using the modified etch parameters to produce a recess in the dielectric/substrate material having a desired profile and depth at operation 915*b*. In some embodiments, the modified etch parameters provide a less anisotropic etch profile within exposed portion of the dielectric/substrate and thereby provide for a curved, arcuate, or hemispherical recess. In other embodiments the modified etch parameters provide a generally anisotropic etch profile within the exposed portion of dielectric/substrate and thereby provide for a rectangular or cylindrical recess in the dielectric/substrate.

Once the dielectric/substrate etch has reached the predetermined endpoint, the wafer will be transferred to the next operation in the corresponding manufacturing process flow at operation 916.

Figure 10:
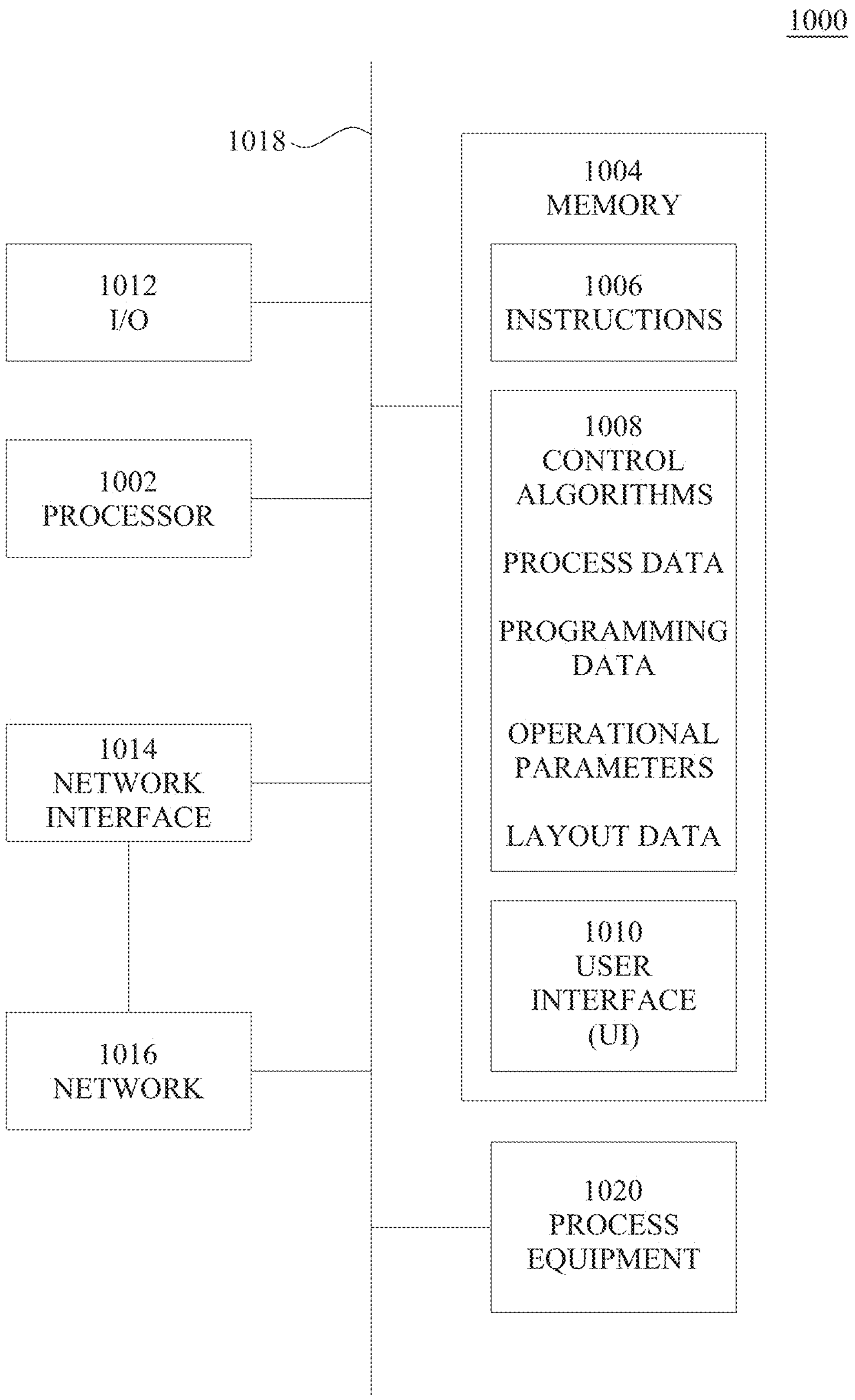
FIG. 10 is a schematic diagram of a system for manufacturing FinFET devices according to some embodiments.

FIG. 10 is a block diagram of an electronic process control (EPC) system 1000, in accordance with some embodiments. Methods used for generating cell layout diagrams corresponding to some embodiments of the FinFET structures detailed above, particularly with respect to the addition and placement of the field plate contact on the RPO structure are implementable, for example, using EPC system 1000, in accordance with some embodiments of such systems. In some embodiments, EPC system 1000 is a general purpose computing device including a hardware processor 1002 and a non-transitory, computer-readable, storage medium 1004. Computer-readable storage medium 1004, amongst other things, is encoded with, i.e., stores, computer program code (or instructions) 1006, i.e., a set of executable instructions. Execution of computer program code 1006 by hardware processor 1002 represents (at least in part) an EPC tool which implements a portion or all of, e.g., the methods described herein in accordance with one or more embodiments (hereinafter, the noted processes and/or methods).

Hardware processor 1002 is electrically coupled to computer-readable storage medium 1004 via a bus 1018. Hardware processor 1002 is also electrically coupled to an I/O interface 1012 by bus 1018. A network interface 1014 is also electrically connected to hardware processor 1002 via bus 1018. Network interface 1014 is connected to a network 1016, so that hardware processor 1002 and computer-readable storage medium 1004 are capable of connecting to external elements via network 1016. Hardware processor 1002 is configured to execute computer program code 1006 encoded in computer-readable storage medium 1004 in order to cause EPC system 1000 to be usable for performing a portion or all of the noted processes and/or methods. In one or more embodiments, hardware processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, computer-readable storage medium 1004 stores computer program code 1006 configured to cause the EPC system 1000 (where such execution represents (at least in part) the EPC tool) to be usable for performing a portion or all of the noted processes and/or methods. In one or more embodiments, computer-readable storage medium 1004 also stores information which facilitates performing a portion or all of the noted processes and/or methods. In one or more embodiments, computer-readable storage medium 1004 stores process control data 1008 including, in some embodiments, control algorithms, process variables and constants, target ranges, set points, programming control data, and code for enabling statistical process control (SPC) and/or model predictive control (MPC) based control of the various processes.

EPC system 1000 includes I/O interface 1012. I/O interface 1012 is coupled to external circuitry. In one or more embodiments, I/O interface 1012 includes a keyboard, keypad, mouse, trackball, trackpad, touchscreen, and/or cursor direction keys for communicating information and commands to hardware processor 1002.

EPC system 1000 also includes network interface 1014 coupled to hardware processor 1002. Network interface 1014 allows EPC system 1000 to communicate with network 1016, to which one or more other computer systems are connected. Network interface 1014 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 1000.

EPC system 1000 is configured to send information to and receive information from fabrication tools 1020 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 1004.

EPC system 1000 is configured to receive information through I/O interface 1012. The information received through I/O interface 1012 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 1002. The information is transferred to hardware processor 1002 via bus 1018. EPC system 1000 is configured to receive information related to a user interface (UI) through I/O interface 1012. The information is stored in computer-readable medium 1004 as user interface (UI) 1010.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 1000.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
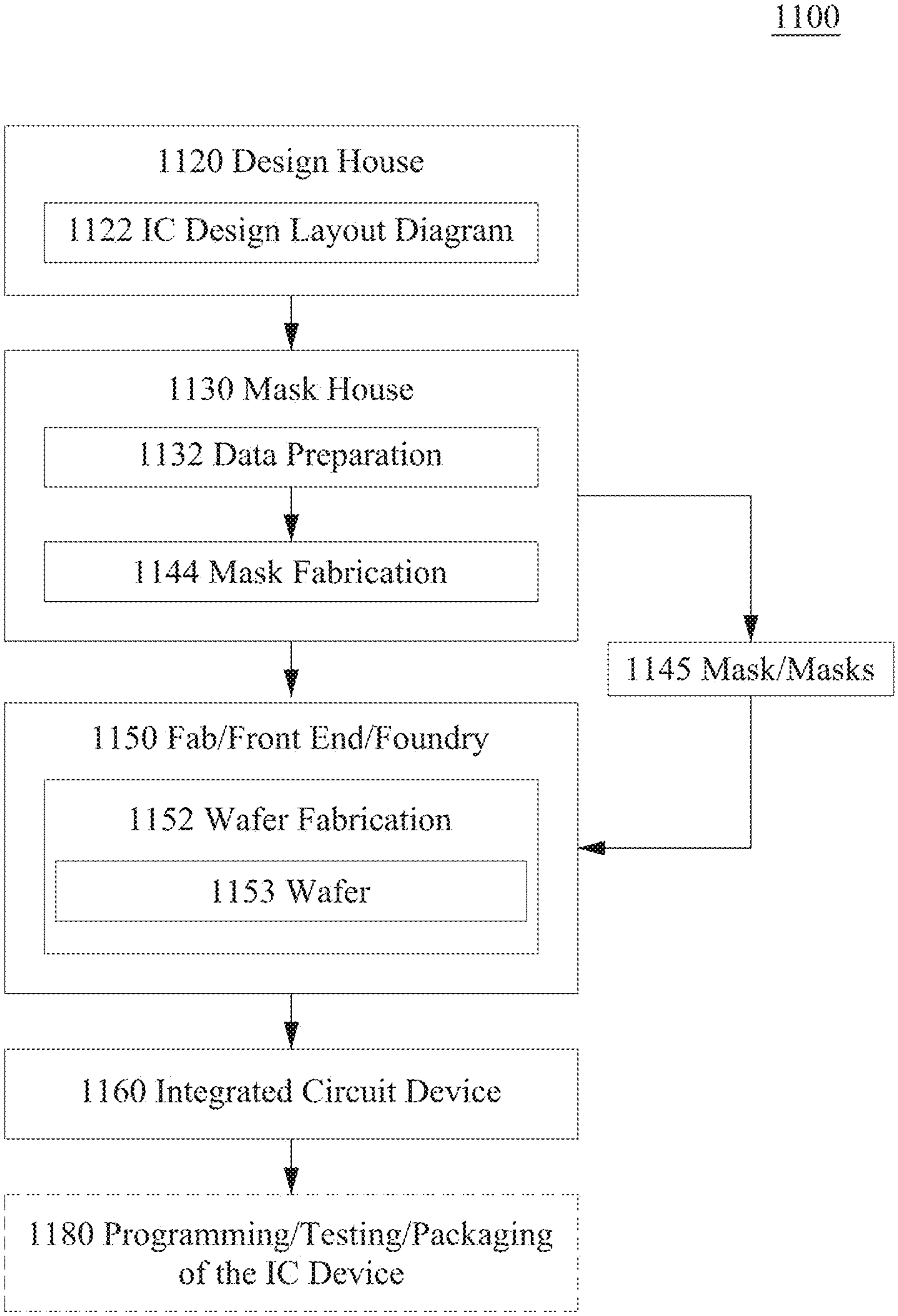
FIG. 11 is a flowchart of IC device design, manufacture, and programming of IC devices according to some embodiments.

FIG. 11 is a block diagram of an integrated circuit (IC) manufacturing system 1100, and an IC manufacturing flow associated therewith, in accordance with some embodiments for manufacturing IC devices that incorporate the improved control over the SSD and EPI profile. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. Once the manufacturing process has been completed to form a plurality of IC devices on a wafer, the wafer is optionally sent to backend or back end of line (BEOL) 1180 for, depending on the device, programming, electrical testing, and packaging in order to obtain the final IC device products. The entities in manufacturing system 1100 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 1120, mask house 1130, and IC Fab 1150 is owned by a single larger company. In some embodiments, two or more of design house 1120, mask house 1130, and IC Fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features.

For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 1130 includes mask data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The IC design layout diagram 1122 is manipulated by mask data preparation 1132 to comply with particular characteristics of the mask writer and/or requirements of IC Fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC Fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, mask data preparation 1132 includes additional features such as a logic operation (LOP) to modify the IC design layout diagram 1122 according to manufacturing rules. Additionally, the processes applied to IC design layout diagram 1122 during mask data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask.

In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC Fab 1150 includes wafer fabrication 1152. IC Fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 1152 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 1145 include a single layer of mask material. In some embodiments, a mask 1145 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures may include the fin structures of Fin Field Effect Transistors (FinFET) with the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC Fab 1150 uses mask(s) 1145 fabricated by mask house 1130 to fabricate IC device 1160. Thus, IC Fab 1150 at least indirectly uses IC design layout diagram 1122 to fabricate IC device 1160. In some embodiments, semiconductor wafer 1153 is fabricated by IC Fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

Figure 12:
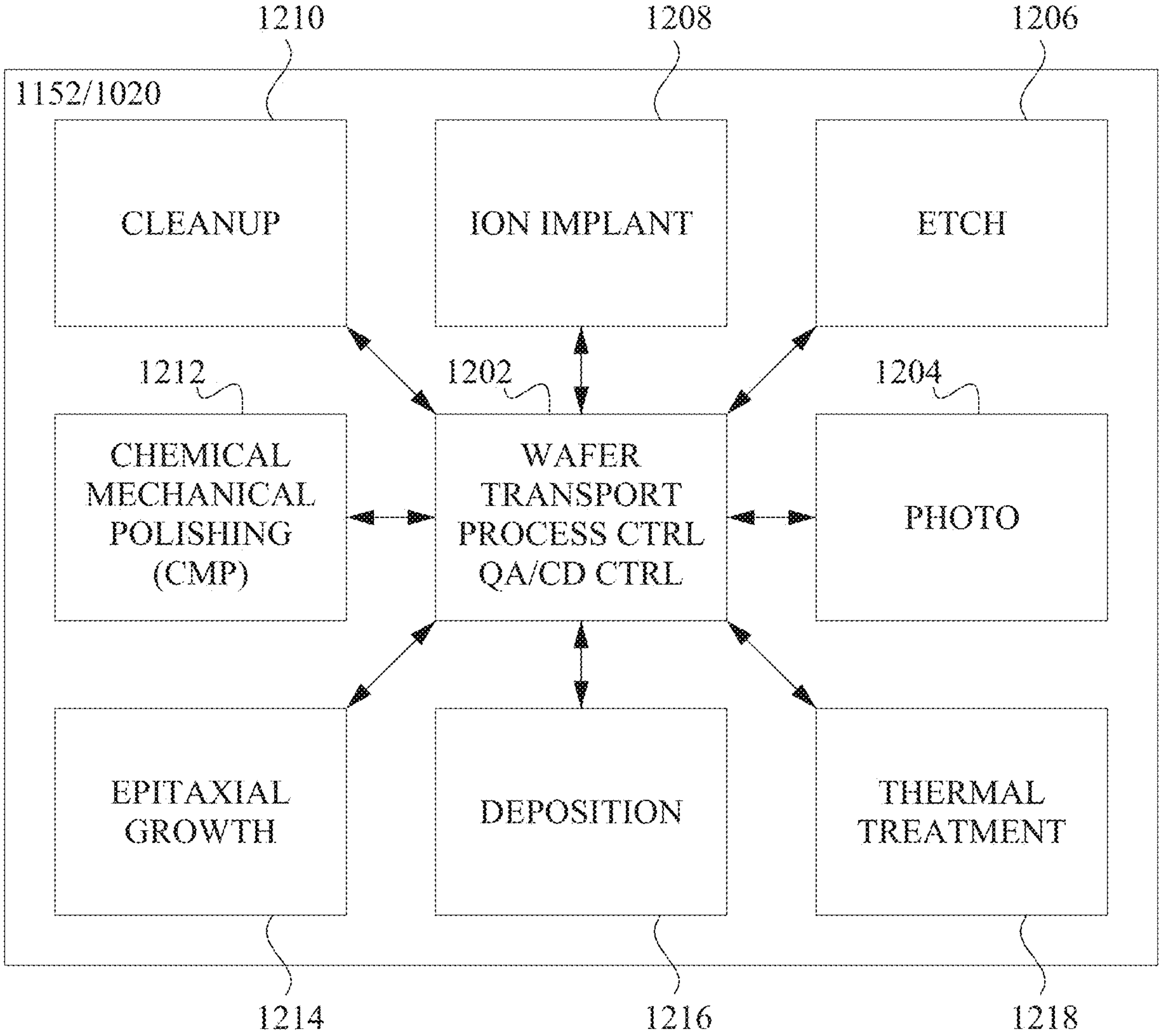
FIG. 12 is a schematic diagram of a processing system for manufacturing FinFET devices according to some embodiments.

FIG. 12 is a schematic diagram of various processing departments defined within a Fab/Front End/Foundry for manufacturing IC devices according to some embodiments as suggested in FIG. 10, specifically in blocks 1008 and 1020 and FIG. 11, specifically in block 1150. The processing departments utilized in front end of line (FEOL) IC device manufacturing typically include a wafer transport operation 1202 for moving the wafers between the various processing departments. In some embodiments, the wafer transport operation will be integrated with an electronic process control (EPC) system according to FIG. 10 and utilized for providing process control operations, ensuring that the wafers being both processed in a timely manner and sequentially delivered to the appropriate processing departments as determined by the process flow. In some embodiments, the EPC system will also provide control and/or quality assurance and parametric data for the proper operation of the defined processing equipment. Interconnected by the wafer transport operation 1202 will be the various processing departments providing, for example, photolithographic operations 1204, etch operations 1206, ion implant operations 1208, clean-up/strip operations 1210, chemical mechanical polishing (CMP) operations 1212, epitaxial growth operations 1214, deposition operations 1216, and thermal treatments 1218.

Additional details regarding integrated circuit (IC) manufacturing systems and an IC manufacturing flows associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, each of which are hereby incorporated, in their entireties, by reference.

Some embodiments of the disclosed methods for manufacturing integrated circuits include the operations of depositing a conductive layer on a substrate, patterning a hard mask layer on the conductive layer to expose a region of the conductive layer, etching a first portion of the exposed region of the conductive layer to form a first opening, forming a first passivation layer on a sidewall of the first opening, etching a second portion of the exposed regions of the conductive layer in the first opening to form a second opening, the second opening being deeper than the first opening, and forming a second passivation layer on a sidewall of the second opening and on the first passivation layer.

Some embodiments of the disclosed methods for manufacturing integrated circuits include one or more additional operations including, for example, forming the conductive layer by depositing a metal gate layer, etching a third portion of the exposed regions of the conductive layer and forming a third passivation layer on a sidewall of the third etched portion, etching an $N^{th}$ portion of the exposed regions of the conductive layer, thereby extending an opening through the conductive layer and exposing a region of a dielectric structure, etching the exposed portion of the dielectric structure to form a recess in the dielectric structure, etching an $N^{th}$ portion of the exposed regions of the conductive layer, thereby extending an opening through the conductive layer and exposing a region of the dielectric structure, etching the exposed region of the dielectric structure thereby extending the opening through the dielectric structure and exposing a region of the substrate, etching the exposed region of the substrate to form a recess in the substrate, etching an $N^{th}$ portion of the exposed regions of the conductive layer, thereby extending an opening through the conductive layer and exposing a region of the substrate, etching the exposed portion of the substrate to form a recess in the substrate, terminating the operation of etching exposed portion of the substrate to limit the recess in the substrate to a depth of no more than 15 nm, forming the first passivation layer further by depositing an oxide, a nitride, an oxynitride, or a mixture thereof, of a metal or a semiconductor, and/or selecting the metal or the semiconductor from a group consisting of Al, Si, Ti, W, and mixtures thereof.

Some embodiments of the disclosed methods for manufacturing integrated circuits include the operations of patterning a hard mask to expose a region of a metal gate layer over a dielectric material, etching the exposed region of the metal gate layer to define an opening, forming a first passivation layer on a sidewall of the opening, determining whether the dielectric material has been exposed in the opening, repeating the steps of etching the exposed region of the metal gate layer to form an extended opening and forming a second passivation layer on the sidewall of the extended opening in response to a determination that the dielectric material is not exposed, and forming a recess in the dielectric material in response to a determination that the dielectric material is exposed.

Some embodiments of the disclosed methods for manufacturing integrated circuits include one or more additional operations including, for example, controlling an etch process whereby the recess has a predetermined profile, controlling a duration of the etching step whereby each etch extends the opening by no more than ⅓ of an initial thickness of the metal gate layer, etching the dielectric material to form the recess, the recess having an arcuate profile along a minor axis, etching the dielectric material to form the recess, the recess having a rectangular arcuate profile along a minor axis, filling the recess in the substrate and the opening with a fill material, and/or removing the first passivation layer from the sidewall of the opening before filling the recess in the substrate and opening with the fill material. Some embodiments of the disclosed semiconductor devices have elements including a substrate, first and second fin structures formed on the substrate, a metal gate layer on the first and second fin structures, a cut metal dielectric structure extending through the metal layer between the first and second fin structures in which the cut metal dielectric structure is configured for electrically isolating a first portion of the metal layer on the first fin structure from a second portion of the metal layer on the second fin structure, with the cut metal dielectric structure having substantially vertical sidewalls, and a passivation layer on the substantially vertical sidewalls of a portion of the opening farthest from the substrate.

Some embodiments of the disclosed semiconductor devices have one or more additional elements including, for example, a recess in the substrate aligned with the isolation structure, a dielectric fill material filling the opening and the recess, an opening having a taper of no more than 2°, and/or a recess having a depth of no more than 15 nanometers (nm).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of some embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing an integrated circuit comprising:

depositing a conductive layer on a substrate;

patterning a hard mask layer on the conductive layer to form an exposed region of the conductive layer;

etching a first portion of the exposed region of the conductive layer to form a first opening;

forming a first passivation layer on a sidewall of the first opening, the first passivation layer laterally extending into the conductive layer;

etching a second portion of the exposed region of the conductive layer in the first opening to form a second opening, the second opening being deeper than the first opening; and forming a second passivation layer on a sidewall of the second opening and on the first passivation layer.

2. The method of manufacturing an integrated circuit according to claim 1, wherein:

forming the conductive layer comprises depositing a metal gate structure.

3. The method of manufacturing an integrated circuit according to claim 1, further comprising:

etching a third portion of the exposed region of the conductive layer to form a third opening, the third opening being deeper than the second opening; and forming a third passivation layer on a sidewall of the third opening.

4. The method of manufacturing an integrated circuit according to claim 1, further comprising:

etching an $N^{th}$ portion of the exposed region of the conductive layer, thereby extending an opening through the conductive layer and exposing a region of a dielectric structure; and etching the exposed region of the dielectric structure to form a recess in the dielectric structure.

5. The method of manufacturing an integrated circuit according to claim 1, further comprising:

etching an $N^{th}$ portion of the exposed region of the conductive layer, thereby extending an opening through the conductive layer and exposing a region of a dielectric structure;

etching the exposed region of the dielectric structure thereby extending the opening through the dielectric structure and exposing a region of the substrate; and etching the exposed region of the substrate to form a recess in the substrate.

6. The method of manufacturing an integrated circuit according to claim 1, further comprising:

etching an $N^{th}$ portion of the exposed region of the conductive layer, thereby extending an opening through the conductive layer and exposing a region of the substrate; and etching the exposed region of the substrate to form a recess in the substrate.

7. The method of manufacturing an integrated circuit according to claim 6, further comprising:

controlling the operation of etching the exposed region of the substrate to limit the recess in the substrate to a depth of no more than 15 nm.

8. The method of manufacturing an integrated circuit according to claim 1, wherein forming the first passivation layer comprises depositing an oxide, a nitride, an oxynitride, or a mixture thereof, of a metal or a semiconductor.

9. The method of manufacturing an integrated circuit according to claim 8, further comprising:

selecting the metal or the semiconductor from a group consisting of Al, Si, Ti, W, and mixtures thereof.

10. A method of manufacturing an integrated circuit comprising:

patterning a hard mask to uncover an exposed region of a metal gate layer over a dielectric material;

etching the exposed region of the metal gate layer to define an opening;

forming a first passivation layer on a sidewall of the opening;

determining whether the dielectric material has been exposed in the opening;

repeating the steps of etching the exposed region of the metal gate layer to form an extended opening and forming another passivation layer on a sidewall of the extended opening in response to a determination that the dielectric material is not exposed;

forming a recess in the dielectric material in response to a determination that the dielectric material is exposed; and controlling a duration of the etching step whereby each etch extends the opening by no more than ⅓ of an initial thickness of the metal gate layer.

11. The method of manufacturing an integrated circuit according to claim 10, wherein forming the recess further comprises:

controlling an etch process whereby the recess has a predetermined profile.

12. The method of manufacturing an integrated circuit according to claim 10, wherein forming the recess in the dielectric material further comprises:

etching the dielectric material to form the recess, the recess having an arcuate profile along a minor axis.

13. The method of manufacturing an integrated circuit according to claim 10, wherein forming the recess in the dielectric material further comprises:

etching the dielectric material to form the recess, the recess having a rectangular arcuate profile along a minor axis.

14. The method of manufacturing an integrated circuit according to claim 10, further comprising:

filling the recess and the opening with a fill material.

15. The method of manufacturing an integrated circuit according to claim 14, further comprising:

removing an accumulation of the passivation layers from the sidewall of the opening before filling the recess and the opening with the fill material.

16. A method of manufacturing a semiconductor device comprising:

forming a first fin structure and a second fin structure extending above a substrate;

forming a metal layer on the first and second fin structures;

forming an isolation structure through the metal layer to separate a first portion of the metal layer on the first fin structure and a second portion of the metal layer on the second fin structure, wherein the isolation structure has substantially vertical sidewalls; and performing one or more oxidation and/or nitridation process on the metal layer to form a passivation structure adjacent at least an upper portion of the isolation structure, the passivation structure having a wider portion of the passivation structure above a narrower portion of the passivation structure.

17. The method of manufacturing a semiconductor device according to claim 16, further comprising:

extending a lower portion of the isolation structure through the metal layer and into the substrate.

18. The method of manufacturing a semiconductor device according to claim 16, further comprising:

forming the passivation structure with a tapered sidewall.

19. The method of manufacturing a semiconductor device according to claim 16, further comprising:

forming the passivation structure with a stepped sidewall.

20. The method of manufacturing a semiconductor device according to claim 16, wherein the passivation structure is formed to extend laterally into the metal layer.

* * * * *